United States Patent
Takahashi et al.

(12)

(10) Patent No.: US 11,949,005 B2
(45) Date of Patent: Apr. 2, 2024

(54) SEMICONDUCTOR DEVICE

(71) Applicant: FUJI ELECTRIC CO., LTD., Kanagawa (JP)

(72) Inventors: Misaki Takahashi, Matsumoto (JP); Yuichi Harada, Matsumoto (JP); Kouta Yokoyama, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 8 days.

(21) Appl. No.: 17/847,174

(22) Filed: Jun. 23, 2022

(65) Prior Publication Data

US 2022/0328664 A1    Oct. 13, 2022

Related U.S. Application Data

(63) Continuation of application No. 16/773,889, filed on Jan. 27, 2020, now Pat. No. 11,380,784, which is a
(Continued)

(30) Foreign Application Priority Data

Feb. 14, 2018    (JP) ................................. 2018-024211

(51) Int. Cl.
*H01L 29/73*    (2006.01)
*H01L 27/07*    (2006.01)
(Continued)

(52) U.S. Cl.
CPC ...... *H01L 29/7393* (2013.01); *H01L 27/0711* (2013.01); *H01L 29/861* (2013.01); *H03K 17/08142* (2013.01); *H03K 17/567* (2013.01)

(58) Field of Classification Search
CPC ............ H01L 29/7393; H01L 27/0711; H01L 29/861; H01L 27/0727; H01L 29/0696;
(Continued)

(56) References Cited

U.S. PATENT DOCUMENTS 10,438,852 B2 * 10/2019 Kakimoto ............. H01L 29/083
2010/0156506 A1 * 6/2010 Tsuzuki .............. H01L 27/0664
257/140
(Continued)

FOREIGN PATENT DOCUMENTS

CN    107112324 A    8/2017
JP    2001217419 A    8/2001
(Continued)

OTHER PUBLICATIONS

Office Action issued for counterpart Chinese Application 201880052063.8, issued by The State Intellectual Property Office of People's Republic of China dated Jan. 12, 2023.
(Continued)

*Primary Examiner* — S M Sohel Imtiaz

(57) ABSTRACT

Provided is a semiconductor device that includes a first conductivity type well region below a gate runner portion, wherein a diode region includes first contact portions, a first conductivity type anode region, and a second conductivity type cathode region; wherein the well region contacts the diode region in the first direction, and when an end of the well region, an end of at least one of first contact portions, and an end of the cathode region that face one another in the first direction are imaginary projected on an upper surface of the semiconductor substrate, a first distance is longer than a second distance, the first distance being a distance between the end of the well region and the end of the cathode region, and the second distance being a distance between the end of the well region and the end of the at least one first contact portion.

20 Claims, 24 Drawing Sheets

Related U.S. Application Data continuation of application No. PCT/JP2018/027937, filed on Jul. 25, 2018.

(51) Int. Cl.
*H01L 29/739* (2006.01)
*H01L 29/861* (2006.01)
*H03K 17/0814* (2006.01)
*H03K 17/567* (2006.01)

(58) Field of Classification Search
CPC ... H01L 29/423; H01L 29/0619; H01L 29/32; H01L 29/407; H01L 29/8613; H01L 21/322; H01L 29/7397; H03K 17/08142; H03K 17/567
See application file for complete search history.

(56) References Cited

U.S. PATENT DOCUMENTS

| | | | |
|---|---|---|---|
| 2010/0018756 A1 | 7/2010 | Hiromitsu | |
| 2010/0187567 A1* | 7/2010 | Tanabe | H01L 29/1095 257/E29.198 |
| 2012/0132954 A1* | 5/2012 | Kouno | H01L 29/8611 257/140 |
| 2016/0293595 A1* | 10/2016 | Narazaki | H01L 29/41741 |
| 2017/0018547 A1* | 1/2017 | Naito | H01L 29/8613 |
| 2017/0018636 A1* | 1/2017 | Naito | H01L 29/7397 |
| 2017/0084610 A1* | 3/2017 | Kouno | H01L 29/0696 |
| 2017/0162562 A1* | 6/2017 | Haruguchi | H01L 29/1004 |
| 2017/0162662 A1 | 6/2017 | Naito | |
| 2017/0236926 A1 | 8/2017 | Imagawa | |
| 2018/0061644 A1* | 3/2018 | Laven | H10N 15/00 |
| 2018/0151711 A1* | 5/2018 | Yamada | H01L 29/8613 |
| 2018/0158815 A1 | 6/2018 | Onozawa | |
| 2018/0182754 A1 | 6/2018 | Naito | |
| 2019/0096878 A1* | 3/2019 | Arakawa | H01L 27/0727 |

FOREIGN PATENT DOCUMENTS

| | | |
|---|---|---|
| JP | 2001332727 A | 11/2001 |
| JP | 2011040781 A | 2/2011 |
| JP | 2011243694 A | 12/2011 |
| JP | 2012129504 A | 7/2012 |
| JP | 2016197678 A | 11/2016 |
| JP | 2017028244 A | 2/2017 |
| JP | 2017103400 A | 6/2017 |
| JP | 2017135255 A | 8/2017 |
| JP | 2017147300 A | 8/2017 |
| JP | 2017224685 A | 12/2017 |
| WO | 2016098199 A1 | 6/2016 |
| WO | 2017141998 A1 | 8/2017 |
| WO | 2017155122 A1 | 9/2017 |

OTHER PUBLICATIONS

International Search Report and (ISA/237) Written Opinion of the International Search Authority for International Patent Application No. PCT/JP2018/027937, mailed by the Japan Patent Office dated Oct. 2, 2018.
Prosecution History of parent U.S. Appl. No. 16/773,889, filed Jan. 27, 2020.

* cited by examiner

REGION B

SEMICONDUCTOR DEVICE

CROSS-REFERENCE TO RELATED APPLICATIONS

This application is a continuation of U.S. patent application Ser. No. 16/773,889, filed on Jan. 27, 2020, which is a continuation of International Patent Application No. PCT/JP2018/027937, filed on Jul. 25, 2018, the entirety of each of which is incorporated herein by reference. The application also claims priority from the following Japanese patent application, which is explicitly incorporated herein by reference:

No. 2018-024211 filed on Feb. 14, 2018.

BACKGROUND

1. Technical Field

The present invention relates to a semiconductor device.

A Reverse Conducting IGBT (hereinafter referred to as RC-IGBT) having an Insulated Gate Bipolar Transistor (IGBT) region and a Free Wheeling Diode (FWD) region in a semiconductor substrate is known (for example, see Patent Documents 1 to 8).

PRIOR ART DOCUMENT

Patent Documents

Patent Document 1: WO 2017/155122
Patent Document 2: WO 2016/098199
Patent Document 3: Japanese Patent Application Publication No. 2017-135255
Patent Document 4: Japanese Patent Application Publication No. 2017-103400
Patent Document 5: Japanese Patent Application Publication No. 2016-197678
Patent Document 6: Japanese Patent Application Publication No. 2011-243694
Patent Document 7: WO 2017/141998
Patent Document 8: Japanese Patent Application Publication No. 2017-28244

In an RC-IGBT, it is preferable to prevent the reduction of the destructive breakdown withstand capability in an FWD region.

In a first aspect of the present invention, a semiconductor device having a transistor region and a diode region in a semiconductor substrate is provided. The semiconductor device may include a gate runner portion and a first conductivity type well region. The gate runner portion may supply a gate potential to the transistor region. The well region may be provided below the gate runner portion. The diode region may include a plurality of first contact portions, a first conductivity type anode region, and a second conductivity type cathode region. The plurality of first contact portions may extend individually in a first direction on the semiconductor substrate. The plurality of first contact portions may be separated from one another in a second direction on the semiconductor substrate. The second direction may be perpendicular to the first direction. The anode region may be electrically connected with an emitter electrode via the plurality of first contact portions. The emitter electrode may be provided above the semiconductor substrate. The anode region includes a dopant concentration lower than a first conductivity type dopant concentration in the well region. The cathode region may be provided in a range from a lower surface of the semiconductor substrate to a predetermined depth. The well region may contact with the diode region in the first direction. When an end of the well region, an end of at least one first contact portion included in the plurality of first contact portions, and an end of the cathode region that face one another in the first direction are imaginary projected on an upper surface of the semiconductor substrate, a first distance is longer than a second distance, the first distance being a shortest distance between the end of the well region and the end of the cathode region, and the second distance being a shortest distance between the end of the well region and the end of the at least one first contact portion.

The semiconductor substrate may include a second conductivity type drift region and a second conductivity type accumulation region. The drift region may be located below the anode region in the semiconductor substrate. The accumulation region may be provided at least in the diode region. The accumulation region may be located between the anode region and the drift region in a depth direction of the semiconductor substrate. An end of the accumulation region in the first direction may be located between the end of the at least one first contact portion and the end of the cathode region.

The first distance may be longer than a depth from the upper surface of the semiconductor substrate to a bottom of the well region and may be shorter than a thickness from the upper surface to the lower surface of the semiconductor substrate. The second distance may be 40% or more to 60% or less of the first distance. The second distance may be shorter than a half of the first distance.

The transistor region may include a plurality of second contact portions. The plurality of second contact portions may extend individually in a first direction on the semiconductor substrate. The plurality of second contact portions may be separated from one another in a second direction on the semiconductor substrate. The second direction may be perpendicular to the first direction. When the end of the well region and an end of at least one second contact portion included in the plurality of second contact portions that face each other in the first direction are imaginary projected on the upper surface of the semiconductor substrate, a third distance may differ from the second distance, the third distance being a shortest distance between the end of the well region and the end of the at least one second contact portion.

The semiconductor device may include a plurality of transistor regions. The gate runner portion may include an extending gate runner portion and a ring gate runner portion. The extending gate runner portion may be provided between at least two transistor regions included in the plurality of transistor regions adjacent each other in the first direction. The ring gate runner portion may be provided to surround the plurality of transistor regions. The well region may be located below the extending gate runner portion. The well region may be used to define the first distance and the second distance.

The first distance defined by using the well region provided below the extending gate runner portion may be longer than the first distance defined by using the well region provided below the ring gate runner portion. The second distance defined by using the well region provided below the extending gate runner portion may be longer than the second distance defined by using the well region provided below the ring gate runner portion. The semiconductor substrate may include a lifetime killer region. The lifetime killer region may be provided at least below the gate runner portion.

The lifetime killer region may be provided over an entire length of the extending gate runner portion in the first direction below the extending gate runner portion. The lifetime killer region may be provided below the ring gate runner portion in correspondence with a part of a length of the ring gate runner portion in the first direction.

The lifetime killer region may include a concentration distribution peak of a lifetime killer at a position closer to a lower surface of the semiconductor substrate than a bottom of the well region. The lifetime killer region may be provided in a wider range than the cathode region.

The semiconductor substrate may include a second conductivity type drift region and a second conductivity type accumulation region. The drift region may be located below the anode region in the semiconductor substrate. The accumulation region may be provided at least in the diode region. The accumulation region may be located between the anode region and the drift region in a depth direction of the semiconductor substrate. When the end of the well region, the end of at least one first contact portion included in the plurality of first contact portions, the end of the accumulation region, and the end of the cathode region that face one another in the first direction are imaginary projected on an upper surface of the semiconductor substrate, a fourth distance may be longer than a fifth distance. The fourth distance may be a shortest distance between the end of the at least one first contact portion and the end of the accumulation region. The fifth distance may be a shortest distance between the end of the accumulation region and the end of the cathode region.

The semiconductor substrate may include a second conductivity type drift region and a second conductivity type accumulation region. The drift region may be located below the anode region in the semiconductor substrate. The accumulation region may be provided at least in the diode region. The accumulation region may be located between the anode region and the drift region in a depth direction of the semiconductor substrate. When the end of the well region, the end of at least one first contact portion included in the plurality of first contact portions, the end of the accumulation region, and the end of the cathode region that face one another in the first direction are imaginary projected on the upper surface of the semiconductor substrate, the second distance may be longer than a fifth distance. The fifth distance may be a shortest distance between the end of the accumulation region and the end of the cathode region.

The transistor region may include a second conductivity type collector region. The collector region may be provided at a lower-surface side of the semiconductor substrate. A first retracted length of the cathode region may be equal to or longer than the first distance. The first retracted length of the cathode region may be a length from a lower surface side boundary to an upper surface side boundary in the second direction. The lower surface side boundary may be a boundary between the collector region and the cathode region. The upper surface side boundary may be a boundary between the transistor region and the diode region at an upper-surface side of the semiconductor substrate.

The third distance may be shorter than the second distance.

The transistor region may include a plurality of second contact portions that extend individually in a first direction and are separated from one another in a second direction perpendicular to the first direction on the semiconductor substrate. When the end of the well region, an end of at least one first contact portion included in the plurality of first contact portions in the first direction, and an end of at least one second contact portion included in the plurality of second contact portions in the first direction are imaginary projected on the upper surface of the semiconductor substrate, the end of the at least one first contact portions is provided at a position not overlapping with the well region and the end of the at least one second contact portion is provided at a position overlapping with the well region.

The semiconductor substrate may include the diode region, and a lifetime killer region provided at a portion that is included in the transistor region and is in contact with the diode region. A sixth distance may be equal to or shorter than a seventh distance, the sixth distance being a shortest distance between an end of the diode region and the second contact portion provided to a position overlapping with the well region in the second direction, and the seventh distance being a shortest distance between an end of the diode region and an end of the lifetime killer region in the transistor region in the second direction.

The semiconductor substrate may include a second conductivity type drift region located below the anode region in the semiconductor substrate. The semiconductor substrate may include a plurality of second conductivity type accumulation regions that are provided in the diode region and the transistor region and are located between the anode region and the drift region in a depth direction of the semiconductor substrate. An end of at least one of the accumulation regions in the transistor region in the first direction may be closer to the well region than an end of at least one of the accumulation regions in the diode region in the first direction.

The transistor region may include a first conductivity type contact region and a second conductivity type emitter region that are exposed at an upper surface of the semiconductor substrate and are alternately arranged in the first direction. A length of the contact region arranged closest to the gate runner portion in the first direction may be longer than a length of another contact region arranged closer to a center side in the transistor region than the contact region in the first direction.

In a second aspect of the present invention, a semiconductor device including a transistor region and a diode region in a semiconductor substrate is provided. The semiconductor device may include a gate runner portion that supplies a gate potential to the transistor region. The semiconductor device may include a first conductivity type well region provided below the gate runner portion. The diode region may include a plurality of first contact portions that extend individually in a first direction and are separated from one another in a second direction perpendicular to the first direction on the semiconductor substrate. The transistor region may include a plurality of second contact portions that extend individually in a first direction and are separated from one another in a second direction perpendicular to the first direction on the semiconductor substrate. When the end of the well region, an end of at least one first contact portion included in the plurality of first contact portions in the first direction, and an end of at least one second contact portion included in the plurality of second contact portions in the first direction are imaginary projected on the upper surface of the semiconductor substrate, the end of the at least one first contact portion is provided at a position not overlapping with the well region and the end of the at least one second contact portion is provided at a position overlapping with the well region.

The summary clause does not necessarily describe all necessary features of the embodiments of the present invention. The present invention may also be a sub-combination of the features described above.

Figure 12:
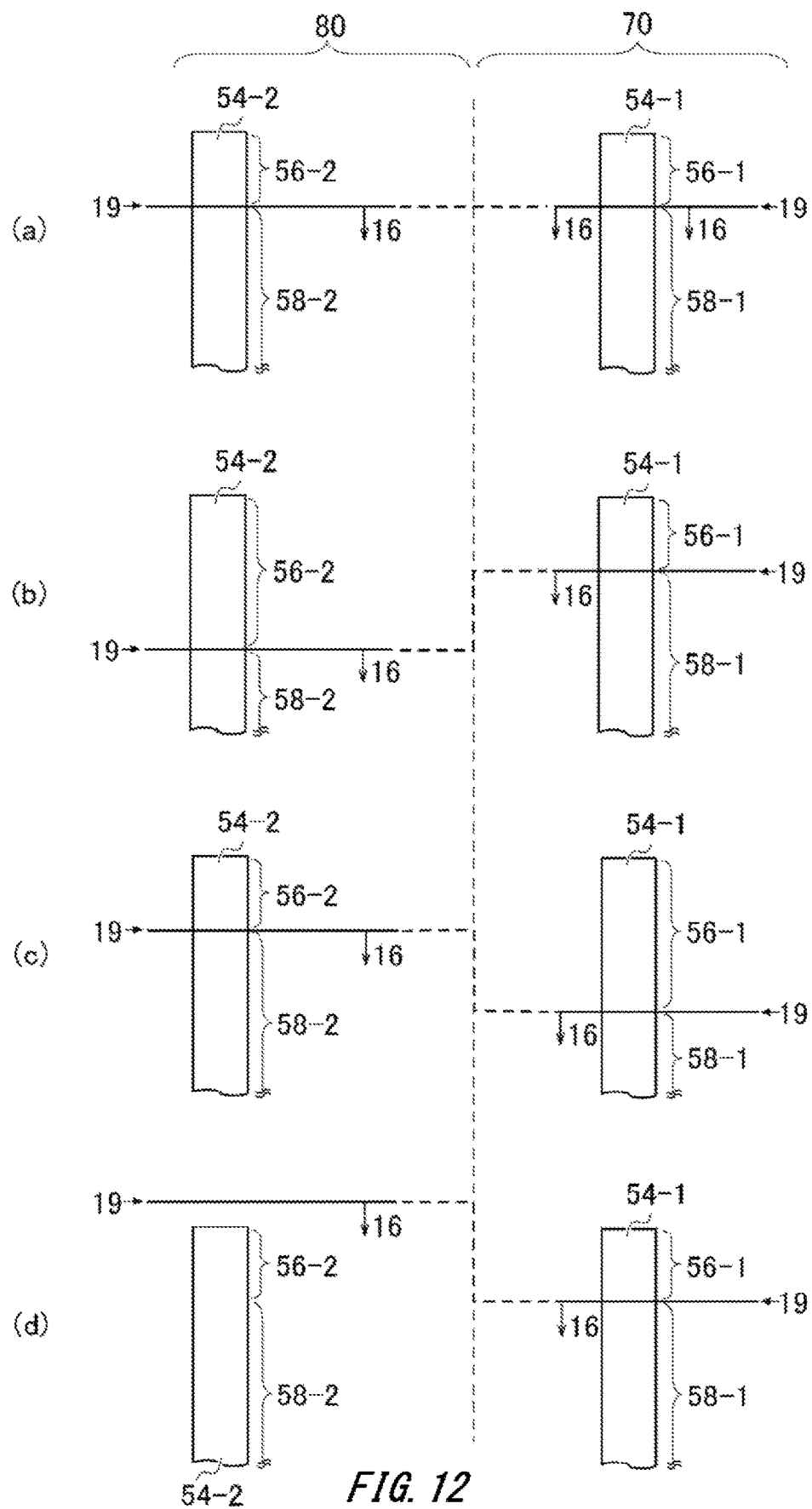

Each of (a) to (d) in FIG. 12 illustrates a positional relationship between the contact portion 54 and the accumulation region 16.

Figure 1:
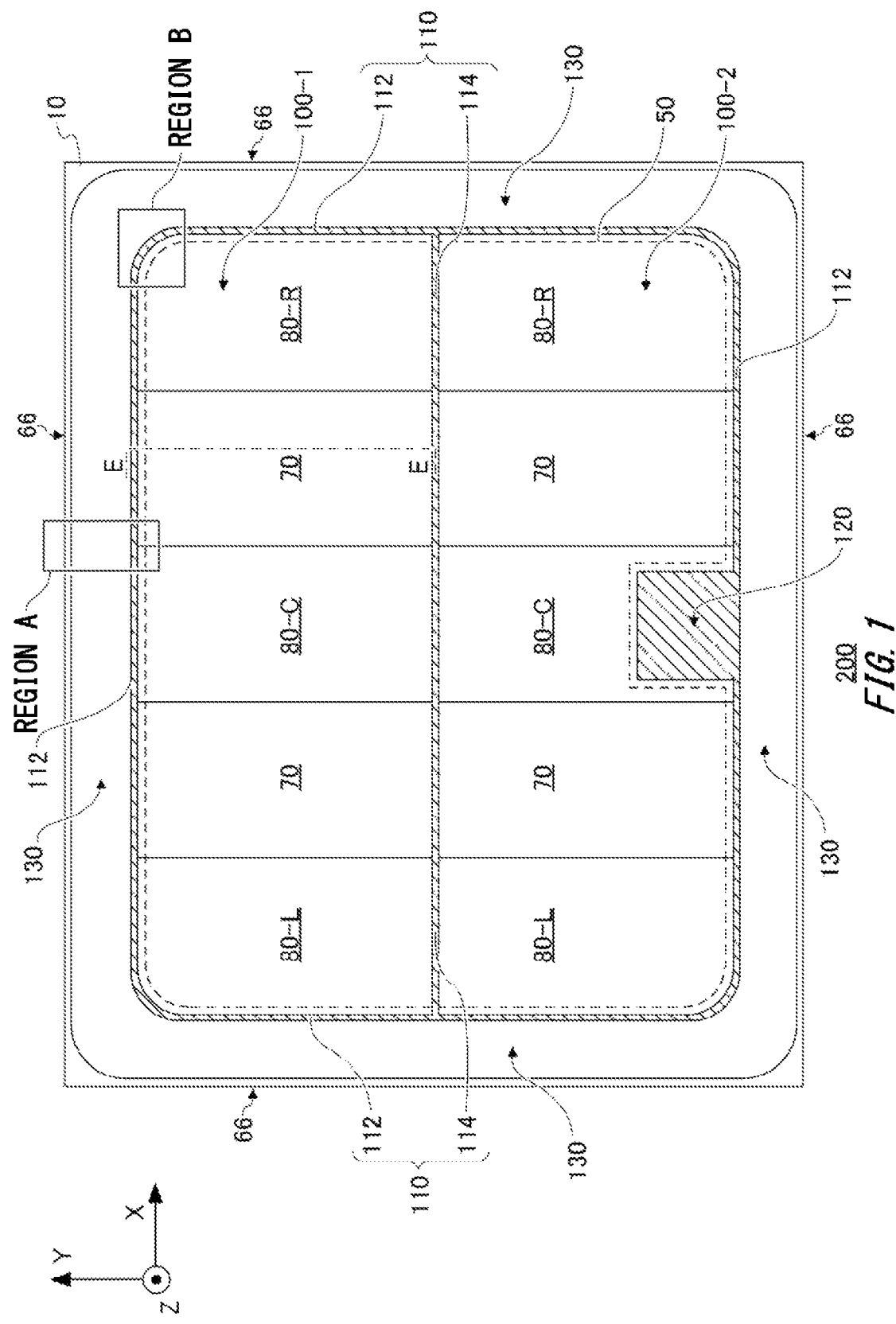
FIG. 1 is a schematic view illustrating an upper surface of a semiconductor device 200.
Figure 13:
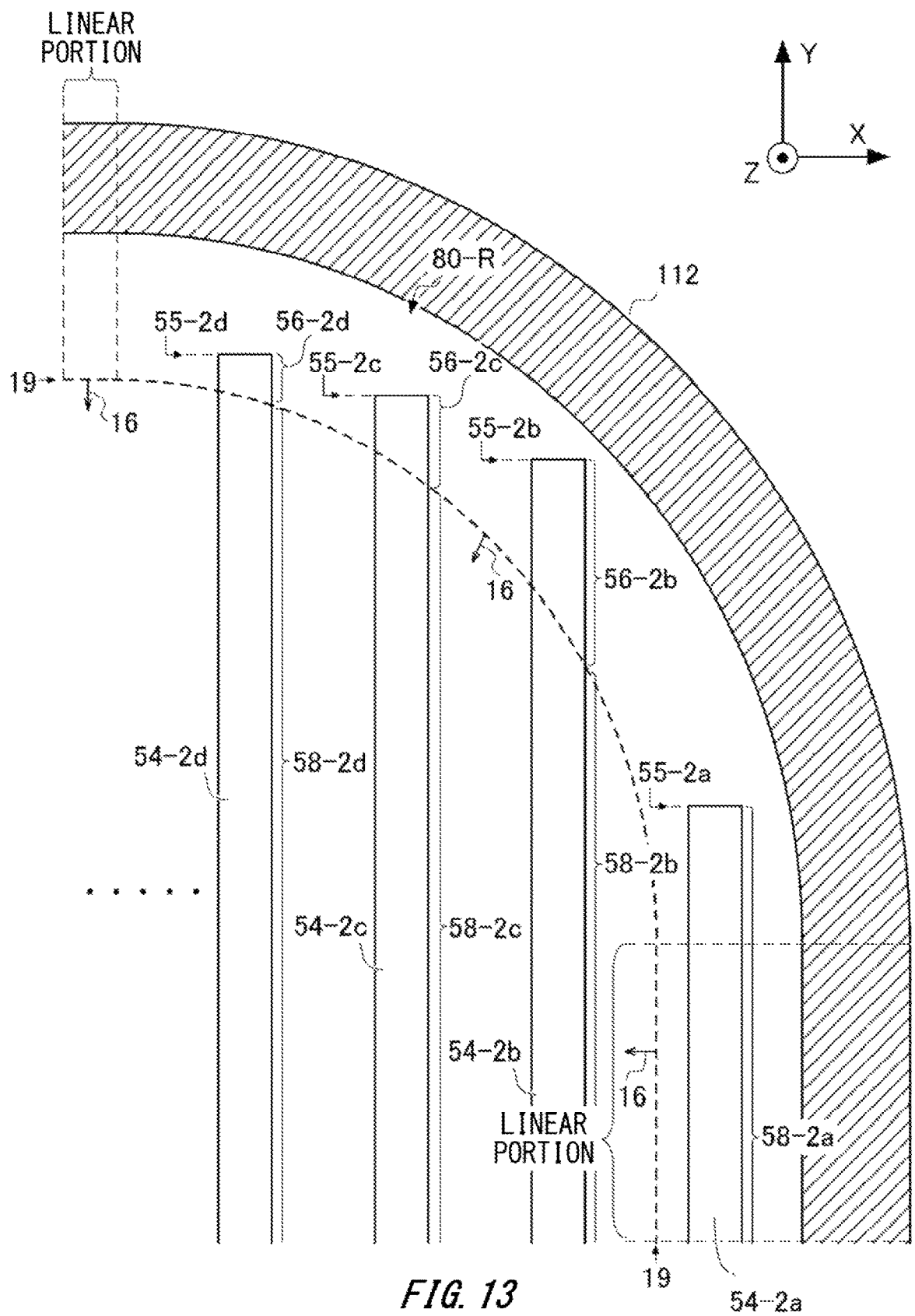

FIG. 13 is an enlarged view of the region B of FIG. 1.

Figure 14:
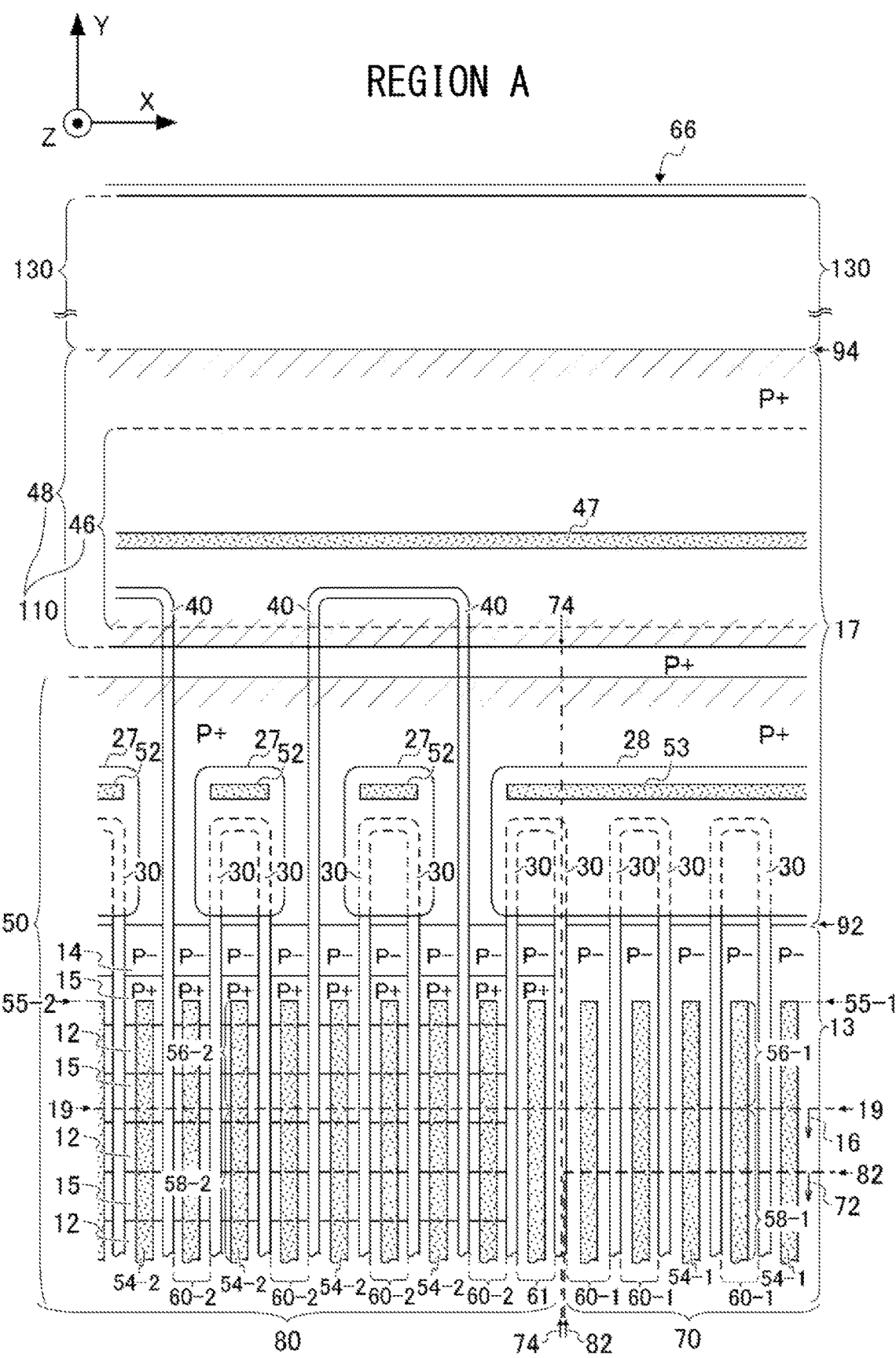

FIG. 14 is an enlarged view of the region A of FIG. 1 in the second embodiment.

Figure 15:
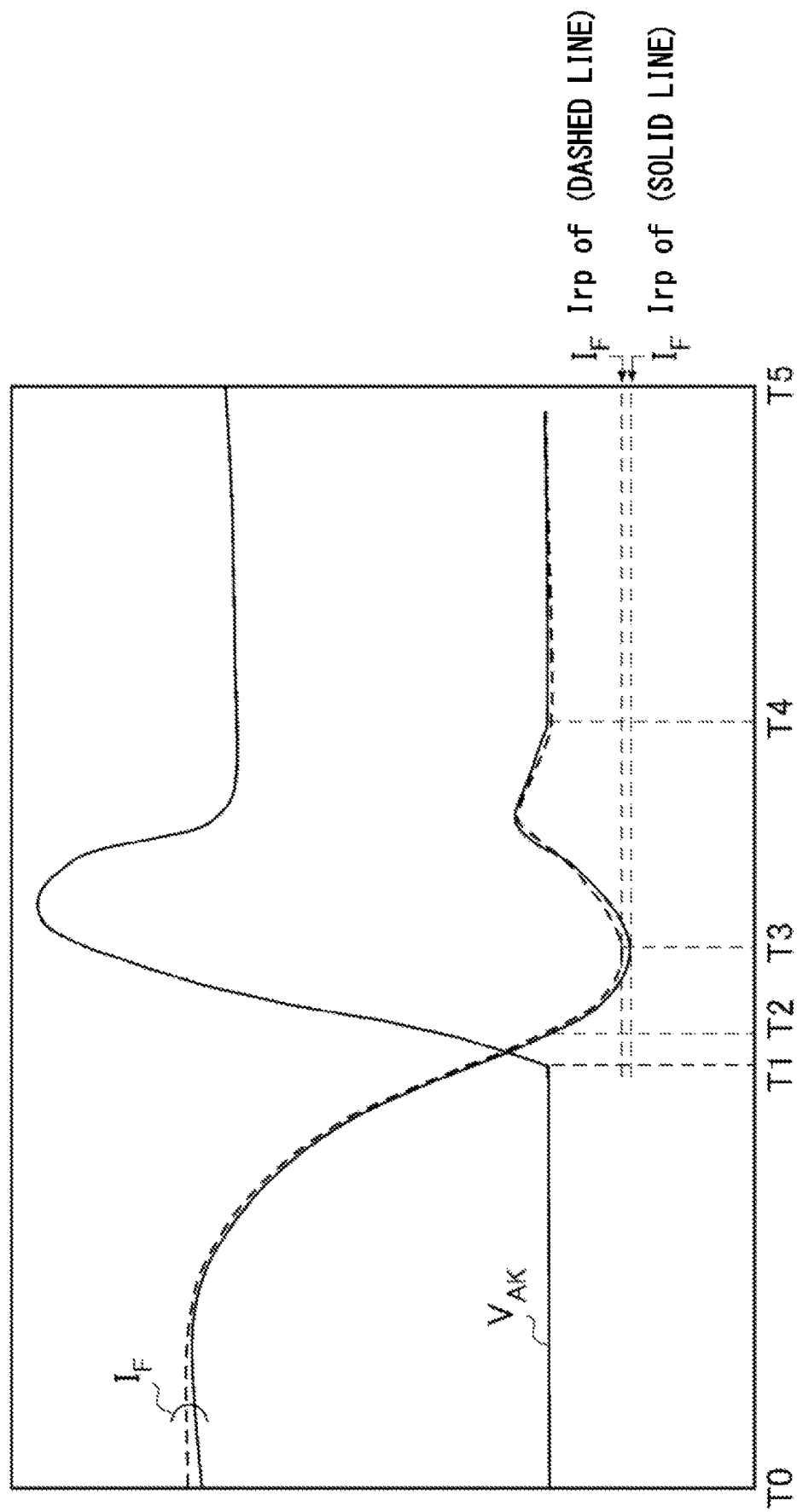

FIG. 15 shows simulation results of the variation over time of an anode-cathode voltage ($V_{AK}$) and the current ($I_F$) in the FWD region 70.

Figure 16:
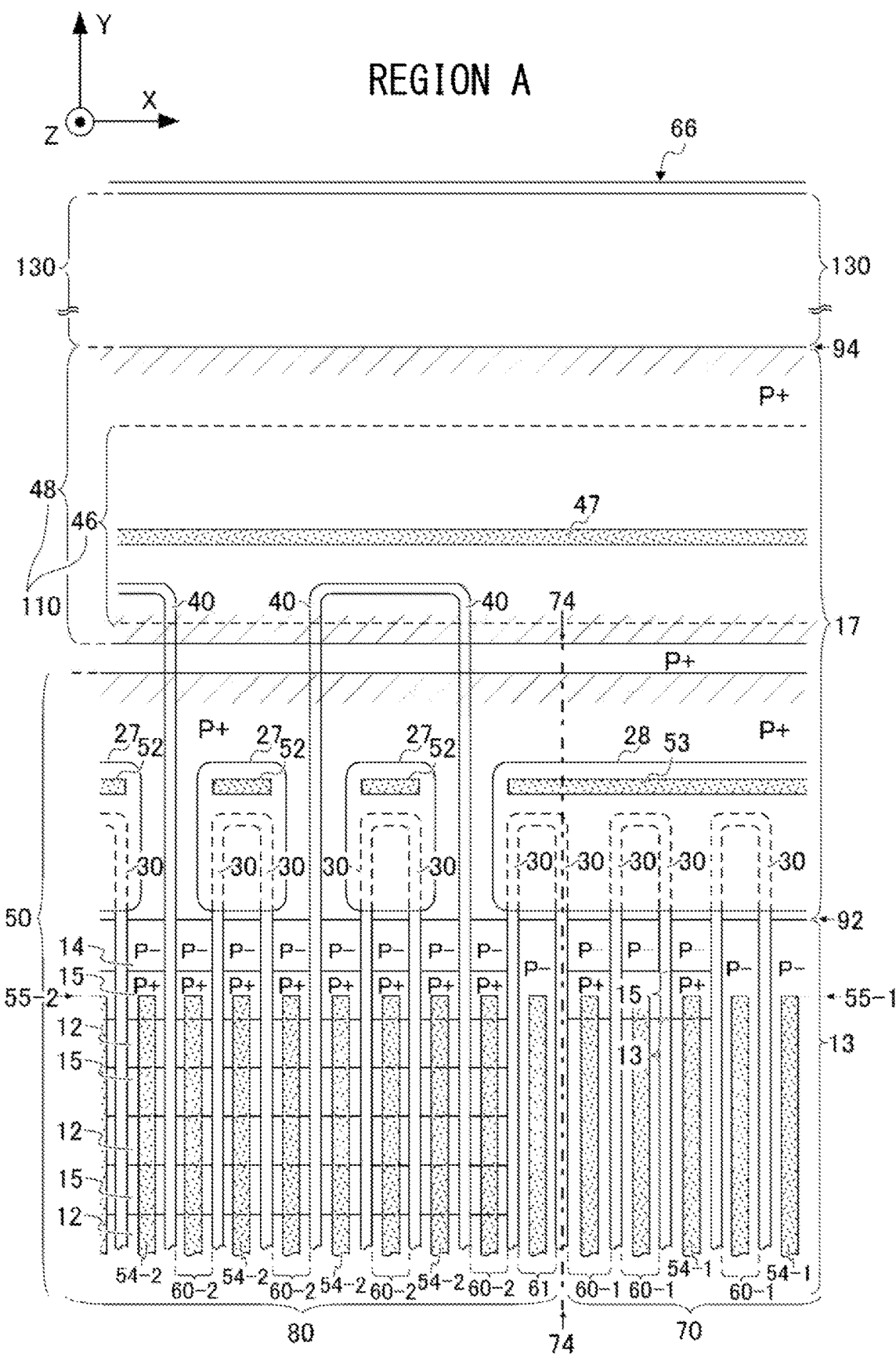

FIG. 16 is an enlarged view of the region A of FIG. 1 in the third embodiment.

Figure 17:
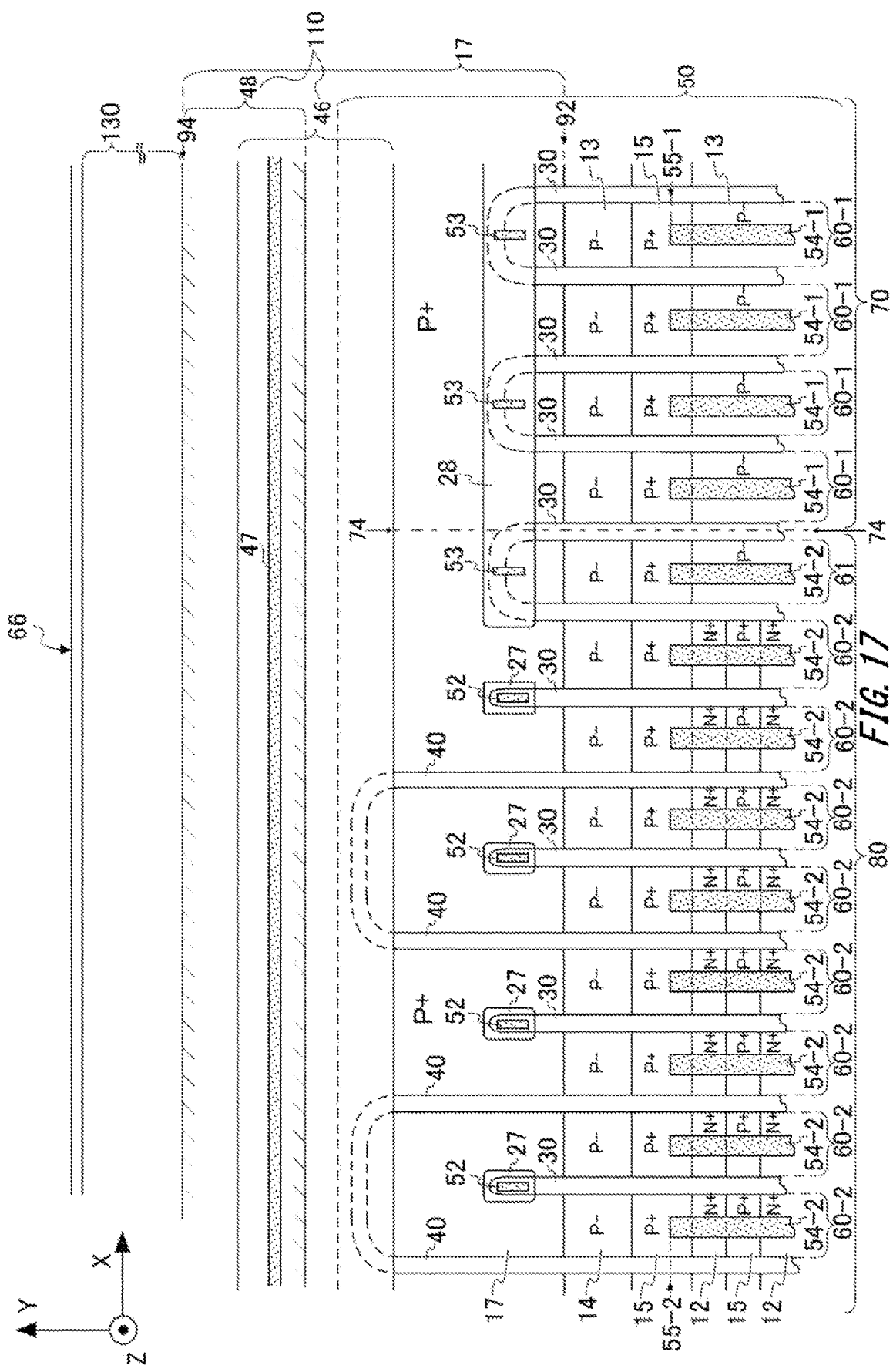

FIG. 17 is an enlarged view of the region A of FIG. 1 in the fourth embodiment.

Figure 18:
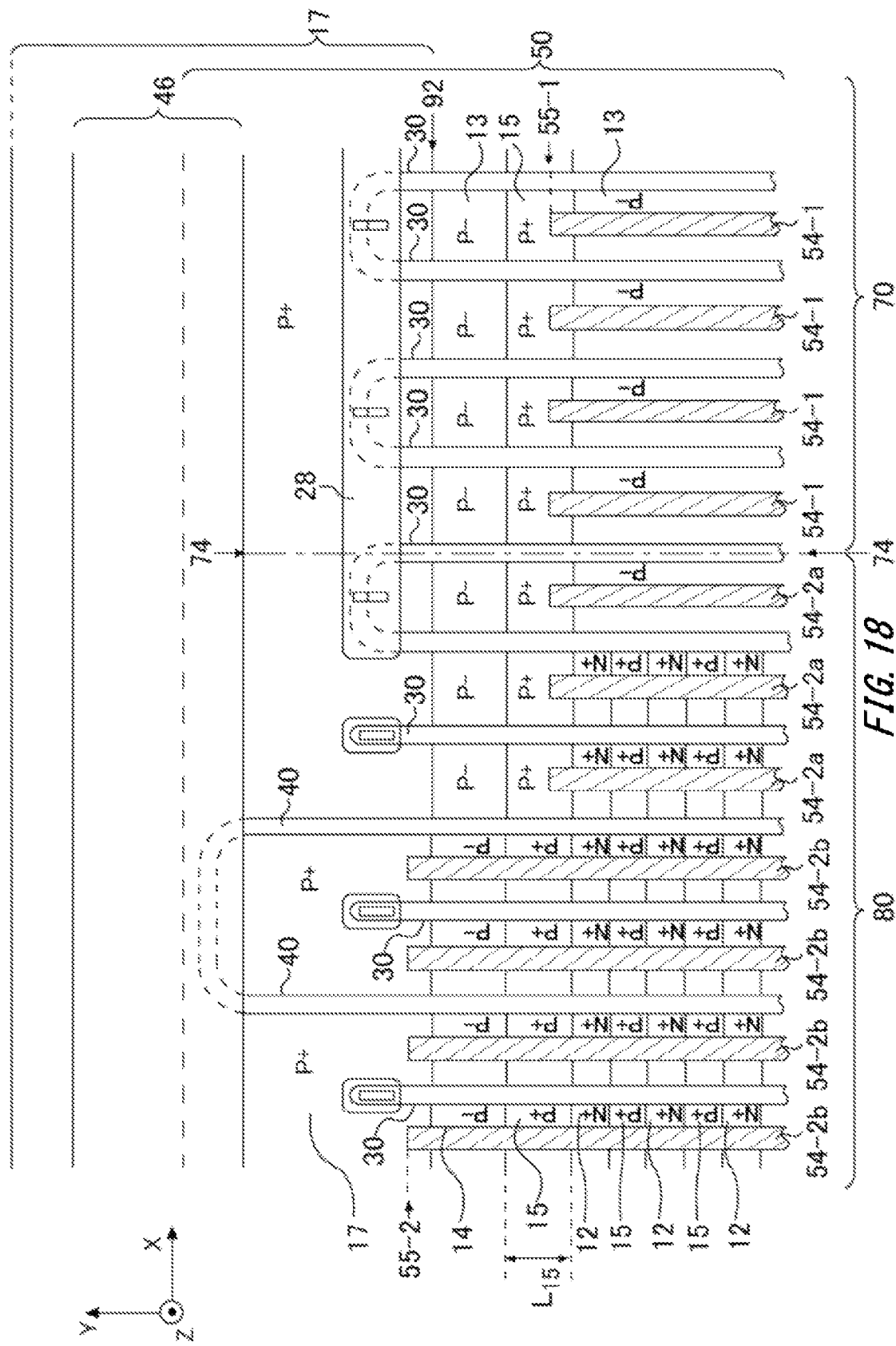

FIG. 18 is an enlarged view of the region A of FIG. 1 in the fifth embodiment.

Figure 19:
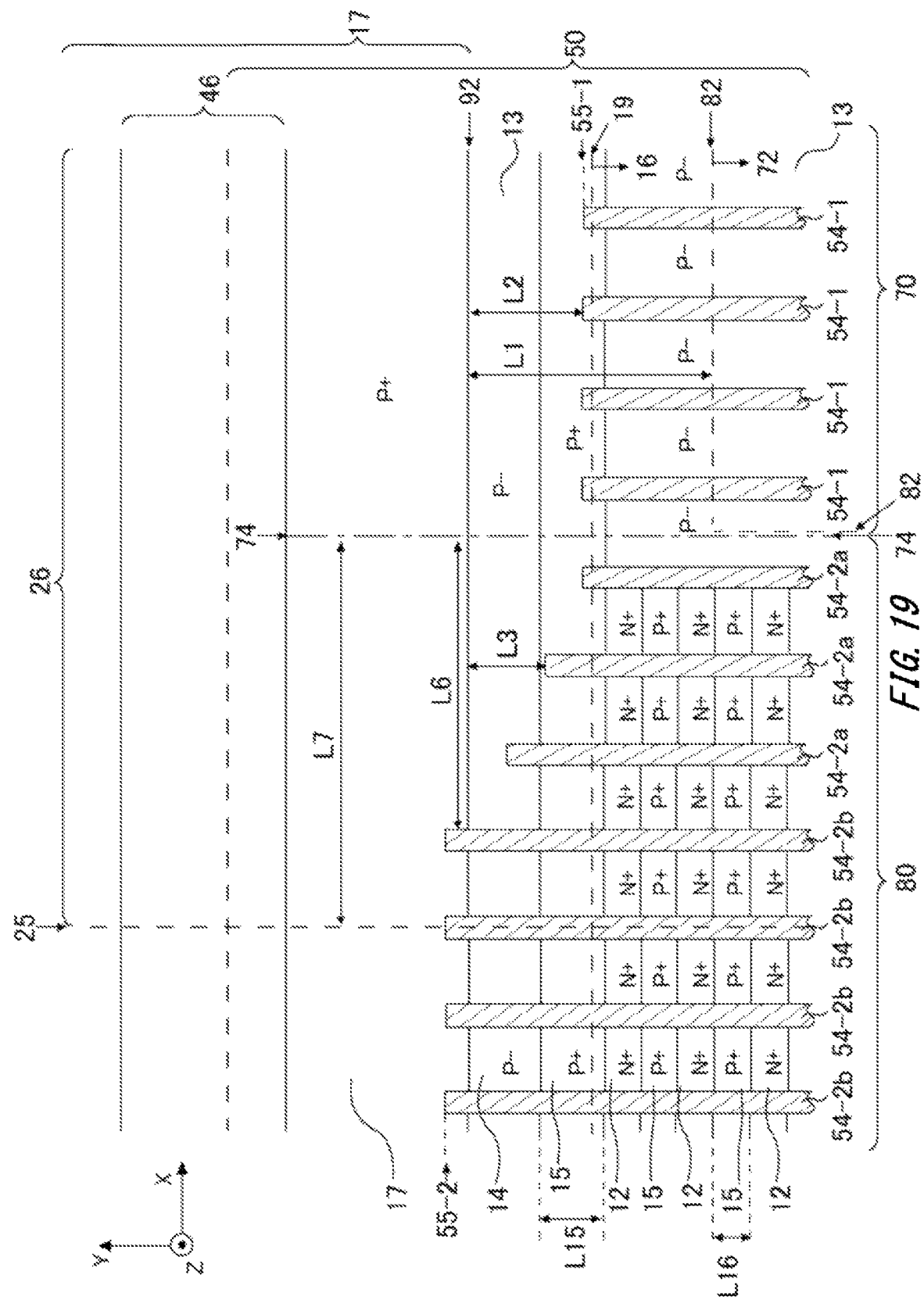

FIG. 19 is an enlarged view of the region A of FIG. 1 in the sixth embodiment.

Figure 20:
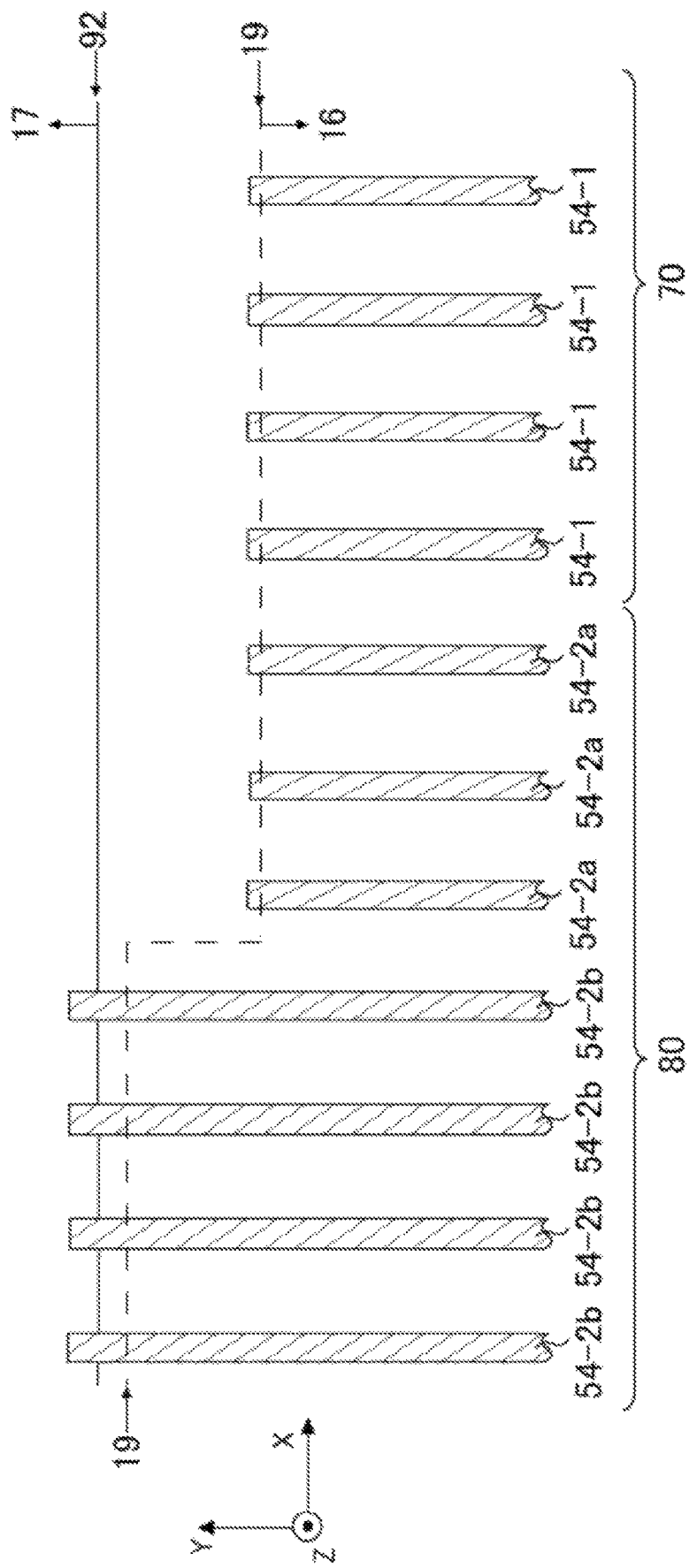

FIG. 20 illustrates a positional relationship between each contact portion 54 and the end 19 of the accumulation region 16 in the fifth embodiment.

Figure 21:
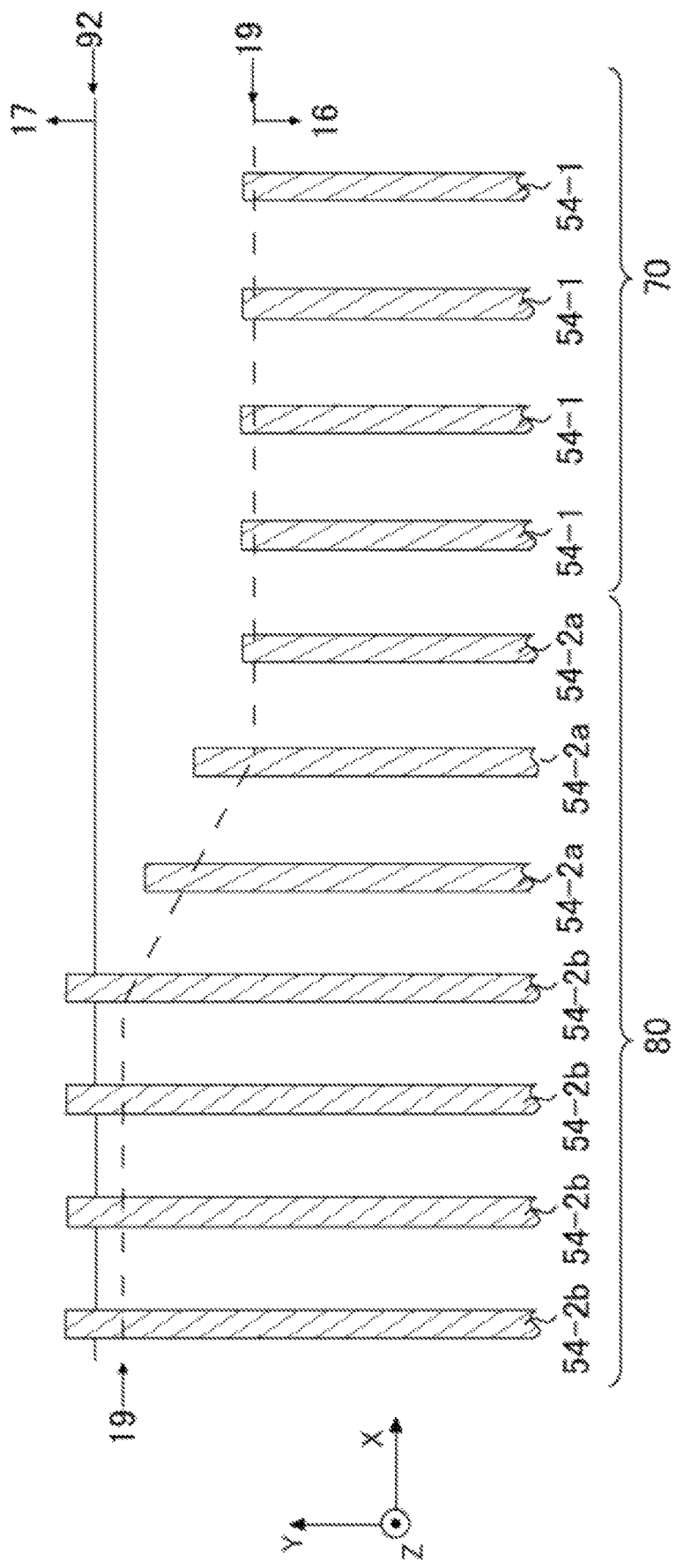

FIG. 21 illustrates a positional relationship between each contact portion 54 and an end 19 of each accumulation region 16 in the sixth embodiment.

Figure 22:
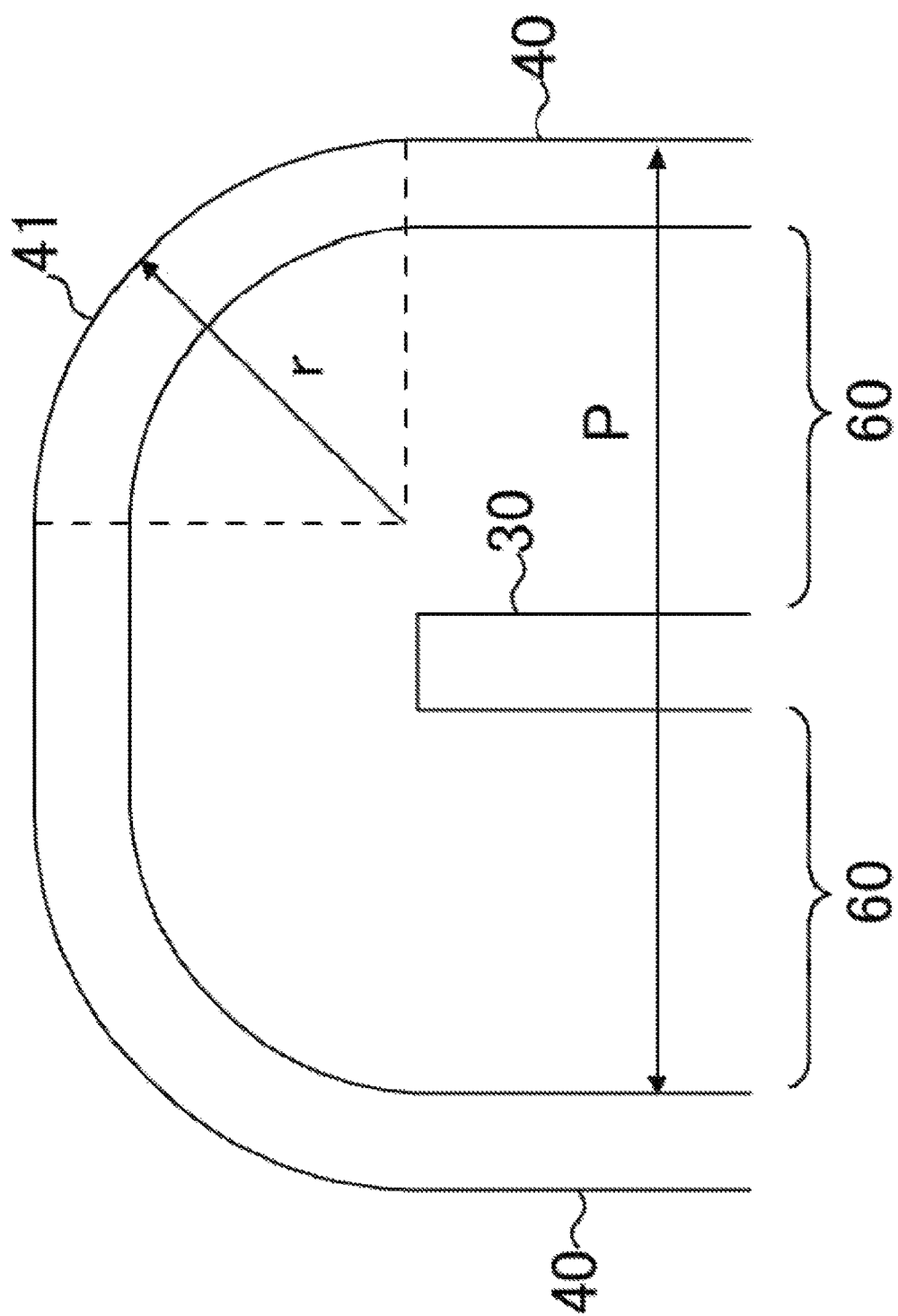

FIG. 22 is an enlarged view of an edge 41 of each gate trench portion 40.

Figure 23:
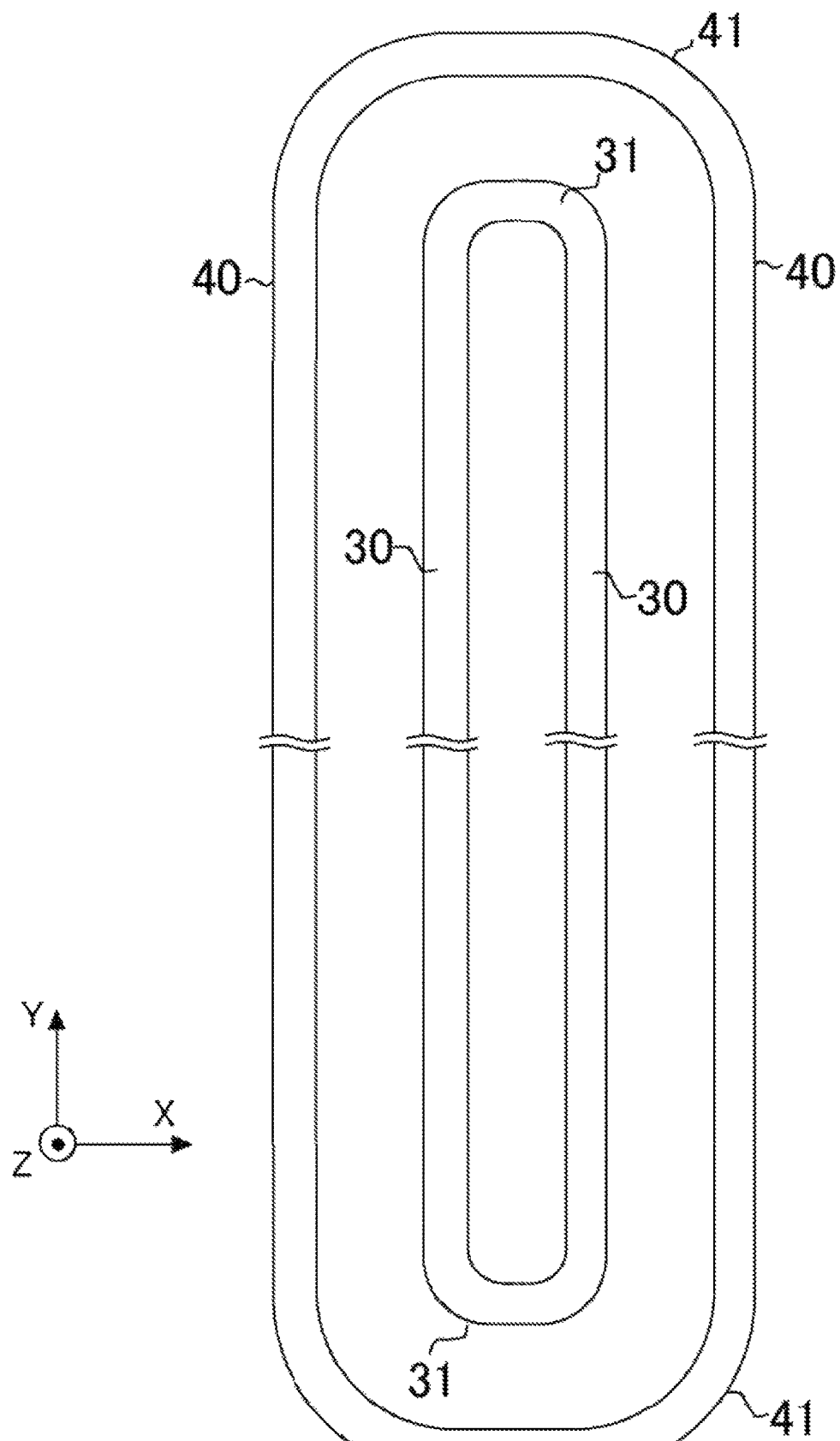

FIG. 23 illustrates exemplary shapes of gate trench portions 40 and dummy trench portions 30 when seen from above.

DESCRIPTION OF EXEMPLARY EMBODIMENTS

Hereinafter, the present invention is described through the embodiments of the invention. However, the following embodiments do not limit the invention according to the claims. Moreover, all the features of the combinations described in the embodiments are not necessarily essential as means for solving the problems of the invention.

In this specification, one side in a direction parallel to the depth direction of a semiconductor substrate 10 is referred to as an "upper" side, and the other side is referred to as a "lower" side. In the present specification, the term "upper surface" denotes one of the two principal surfaces of a substrate, a region, a layer or other parts, and the term "lower surface" denotes the other surface. The direction associated with the terms "upper" and "lower" and the other synonyms is not limited to the gravitational direction or the direction in which semiconductor devices are attached to circuit boards and the like.

FIG. 1 is a schematic view illustrating an upper surface of a semiconductor device 200. The semiconductor device 200 of the present example is an RC-IGBT having an IGBT region 80 and a FWD region 70 on a single semiconductor substrate 10. The IGBT region 80 is one example of a transistor region and the FWD region 70 is one example of a diode region. The semiconductor substrate 10 of the present example has a substantially rectangular shape when seen from above. The semiconductor substrate 10 of the present example has an upper surface parallel to an X-Y plane (first principal surface) at an end in a positive Z-axis direction and has a lower surface parallel to the X-Y plane (second principal surface) at an end in a negative Z-axis direction.

In the present example, X axis and Y axis are perpendicular to each other and Z axis is perpendicular to the X-Y plane. The X axis, Y axis, and Z axis form a so-called right-handed system. In the present example, a Y-axis direction is one example of a first direction and an X-axis direction is one example of a second direction. A Z-axis direction is parallel to a depth direction of the semiconductor substrate 10.

The semiconductor device 200 of the present example includes an active region 100, a gate runner portion 110, a gate pad section 120, and an edge termination region 130. The gate runner portion 110 of the present example includes a ring gate runner portion 112 and an extending gate runner portion 114. The ring gate runner portion 112 of the present example has a rectangular-with-rounded-corners shape. The ring gate runner portion 112 may surround a plurality of IGBT regions 80 and a plurality of FWD regions 70 in the X-Y plane. The ring gate runner portion 112 of the present example surrounds an outer circumference of a group of the plurality of IGBT regions 80 and the plurality of FWD regions 70.

The extending gate runner portion 114 may be provided between at least two IGBT regions 80 adjacent to each other in the Y-axis direction. The extending gate runner portion 114 of the present example extends in the X-axis direction by passing between IGBT regions 80 adjacent in the Y-axis direction and between FWD regions 70 adjacent in the Y-axis direction. The extending gate runner portion 114 of the present example extends from a first side of the rectangular-with-rounded-corners shaped ring gate runner portion 112 parallel in the Y-axis direction to a second side that opposes the first side in the X-axis direction.

The gate runner portion 110 may have a gate runner layer and a gate metal layer above the gate runner layer. The gate runner layer and the gate metal layer may be electrically connected to each other at a predetermined contact portion. The gate runner portion 110 may be electrically connected to the gate pad section 120.

The gate runner portion 110 may have a function of supplying a control signal transmitted from the gate pad section 120 (for example, gate potential) to the IGBT region 80. A wire may be connected to the gate pad section 120 via bonding or the like. The gate pad section 120 may receive a control signal from an external terminal via the wire. The gate pad section 120 may also have a structure in which a gate runner layer and a gate metal layer are stacked as in the gate runner portion 110. The gate pad section 120 of the present example is provided to a cut-out of an IGBT region 80 located at the center in the X-axis direction.

The active region 100 of the present example is provided inside the gate runner portion 110. The active region 100 of the present example includes a first active region 100-1 and a second active region 100-2. The first active region 100-1 is surrounded by a half of the ring gate runner portion 112 in the positive Y-axis direction and the extending gate runner portion 114. On the other hand, the second active region 100-2 is surrounded by a half of the ring gate runner portion 112 in the negative Y-axis direction, the gate pad section 120, and the extending gate runner portion 114. The active region 100 may be a region corresponding to the X-Y plane range of an emitter electrode 50, excluding the region of the extending gate runner portion 114. FIG. 1 illustrates the range of the X-Y plane provided with the emitter electrode 50 by a dashed line.

In the present example, each of the first active region 100-1 and the second active region 100-2 includes a plurality of IGBT regions 80 and a plurality of FWD regions 70. The plurality of IGBT regions 80 may be separated from one another in the X-axis direction. In the present example, three IGBT regions 80 are separated by a predetermined interval in the X-axis direction. IGBT regions 80-L and 80-R are provided to both ends of each of the first active region 100-1 and the second active region 100-2 in the X-axis direction instead of the FWD regions 70. At the center in the X-axis direction, provided is an IGBT region 80-C whose both sides in the X-axis direction are sandwiched by FWD regions 70. The IGBT regions 80-L and 80-R are one example of an outer transistor region and the IGBT region 80-C is one example of an inner transistor region.

In the present example, a single FWD region 70 is provided between two IGBT regions 80 adjacent in the X-axis direction by being contacted to each of the two IGBT regions 80. Therefore, in the active region 100, the number of FWD regions 70 may be smaller than the number of the IGBT regions 80. In the present example, each of the first active region 100-1 and the second active region 100-2 includes two FWD regions 70. The number of IGBT regions 80 and FWD regions 70 is illustrated as just an example, and the number of IGBT regions 80 and FWD regions 70 may be larger or smaller than that in the present example.

An edge termination region 130 may be provided between an outer peripheral end 66 of the semiconductor substrate 10 and the ring gate runner portion 112. The edge termination region 130 may be circularly provided to surround the gate runner portion 110 located outside the active region 100. The edge termination region 130 of the present example surrounds the outside of the ring gate runner portion 112. The edge termination region 130 may have a function of relaxing the electric field concentration on the upper-surface side in the semiconductor substrate 10. The edge termination region 130 includes, for example, a guard ring, a field plate, a RESURF and a structure obtained by combining these.

Figure 2:
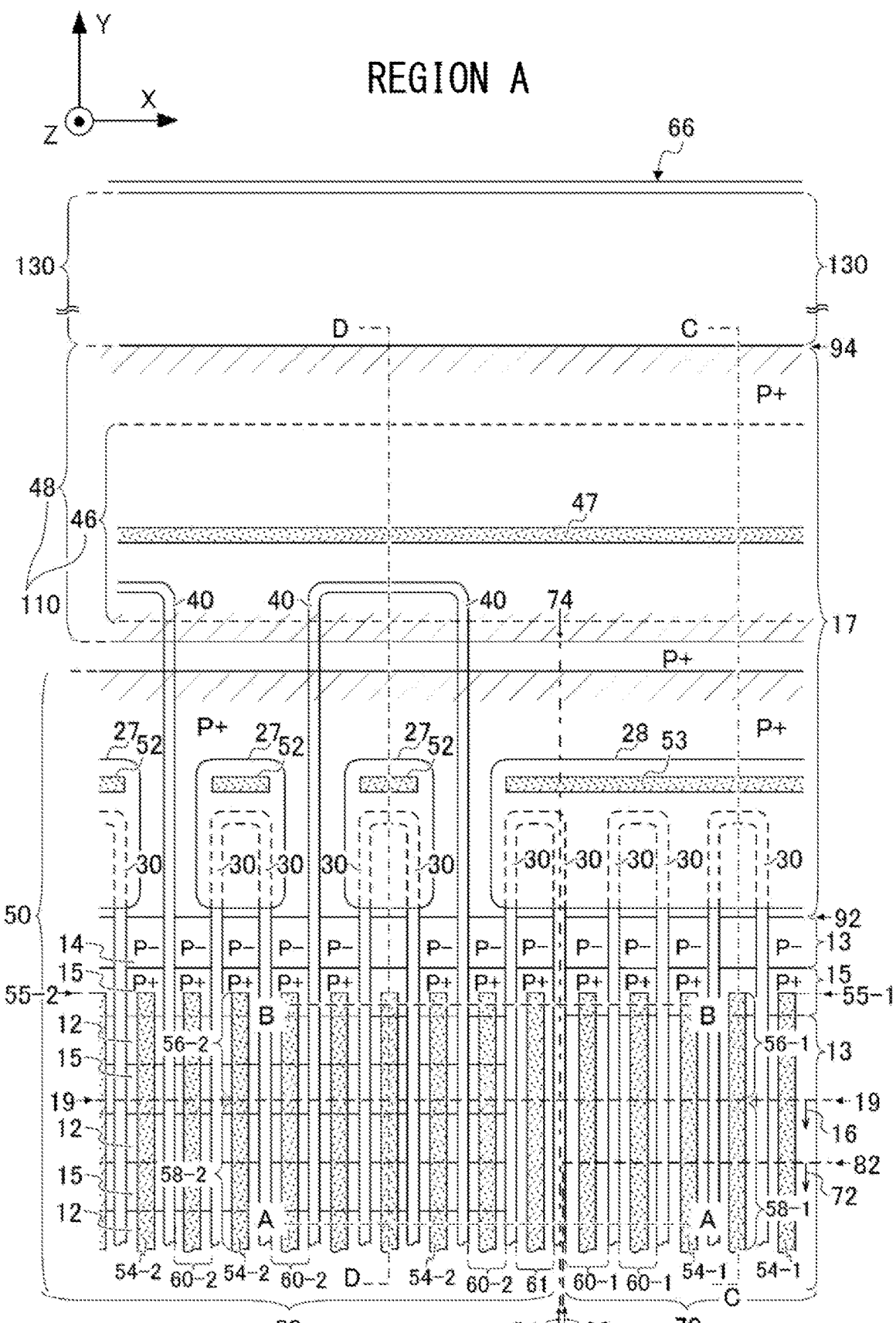
FIG. 2 is an enlarged view of a region A of FIG. 1 in a first embodiment.

FIG. 2 is an enlarged view of a region A of FIG. 1 in the first embodiment. The region A includes a region in which an upper surface side boundary 74 that is a boundary between the IGBT region 80 and the FWD region 70 located at the upper-surface side of the semiconductor substrate 10 intersects the edge termination region 130. FIG. 2 illustrates the upper surface side boundary 74 by a long dashed short dashed line. In the present specification, the upper surface side boundary 74 is a virtual straight line parallel in the Y-axis direction that is located above a dummy trench portion 30 closest to a FWD region 70 side among dummy trench portions 30 in a boundary mesa region 61. The boundary mesa region 61 is a mesa region in contact with a mesa region 60 having an (N+)-type emitter region 12 among a plurality of mesa regions 60-2 in the IGBT region 80 at the FWD region 70 side unlike. The boundary mesa region 61 is also a mesa region 60-2 that is closest to the FWD region 70 in the X-axis direction among the mesa regions 60-2 in the IGBT region 80, and is in contact with the FWD region 70, and does not include the (N+)-type emitter region 12.

In the present specification, a mesa region 60 is defined as an upper part in the semiconductor substrate 10 that is located between two trench portions adjacent in the X-axis direction. In the present example, mesa regions 60-1 in the FWD region 70 are one example of a first mesa region and the mesa regions 60-2 in the IGBT region 80 are one example of a second mesa region. Each of the mesa regions 60-1 in the FWD region 70 may include a (P−)-type anode region 13, a (P+)-type contact region 15, an N-type accumulation region 16, and a (P+)-type well region 17. Each of the mesa regions 60-2 in the IGBT region 80 may include an (N+)-type emitter region 12, a (P−)-type base region 14, a (P+)-type contact region 15, an N-type accumulation region 16, and a (P+)-type well region 17.

The base region 14 may function as a channel formation region and the anode region 13 may function as an anode. The anode region 13 and the base region 14 have different names merely depending on provision regions. The anode region 13 and the base region 14 may be formed via the same dopant implantation step. The anode region 13 and the base region 14 of the present example have the same P-type dopant concentration. The P-type of the present example is an example of a first conductivity type and the N-type is an example of a second conductivity type. However, in another example, a P-type may be a second conductivity type and an N-type may be a first conductivity type. N and P indicate that the majority carriers are electrons and holes respectively. With respect to a symbol "+" or "−" after an alphabet "N" or "P," the symbol "+" means that "N" or "P" with the symbol "+" has a higher carrier concentration than "N" or "P" without the symbol "+," and the symbol "−" means that "N" or "P" with the symbol "−" has a lower carrier concentration than "N" or "P" without the symbol "−."

The semiconductor device 200 has insulating films such as interlayer dielectric films on an upper surface of the semiconductor substrate 10, but these insulating films are omitted in FIG. 2. The insulating films such as interlayer dielectric films may have a plurality of openings at different positions on the X-Y plane. FIG. 2 illustrates a plurality of openings as contact portions 47, 52, 53, and 54. The contact portion 47 is an opening portion for connecting the gate metal layer 48 to the gate runner layer 46.

The contact portion 52 is an opening portion provided in the IGBT region 80 and the contact portion 53 is an opening portion provided in the FWD region 70. The contact portion 52 of the present example connects an island-like connection layer 27 to an emitter electrode 50. The contact portion 53 of the present example connects an island-like connection layer 28 extending in the X-axis direction to an emitter electrode 50. The gate runner layer 46, and the connection layers 27 and 28 of the present example are polysilicon layers formed through the same deposition processes and etching processes.

The contact portion 54 of the present example may connect the emitter electrode 50 to a semiconductor region exposed at the upper surface of the semiconductor substrate 10. In the present example, an extending direction in which the contact portions 54 extend is parallel to the Y-axis direction. The contact portions 54 may have the same shape in the FWD region 70 and the IGBT region 80. The contact portion 54 of the present example has a width smaller than a length of the mesa region 60 in the X-axis direction and has a strip shape extending in the Y-axis direction. In the present example, positions of ends 55 of the contact portions 54 in the Y-axis direction are the same in the FWD region 70 and the IGBT region 80. In FIG. 2, a length from an end of a gate runner portion 110 in the negative Y-axis direction to the end 55 of the contact portion 54 is, for example, 10 μm. With respect to positions of ends 55 in the Y-axis direction, the position of the end 55-2 of the contact portion 54 in the IGBT region 80 in the Y-axis direction may extend outside a position of the end 55-1 of the contact portion 54 in the FWD region 70 in the Y-axis direction.

The semiconductor device 200 of the present example has dummy trench portions 30 and gate trench portions 40 individually provide from the upper surface of the semiconductor substrate 10 to a predetermined depth. In the present specification, the dummy trench portions 30 and the gate trench portions 40 may be collectively referred to as trench portions. While a gate conductive portion of each of the gate trench portions 40 receives gate potentials, the same potentials as the emitter electrode 50 (emitter potentials) instead of gate potentials are given to a dummy trench conductive portion of each of the dummy trench portions 30.

In the present example, the FWD region 70 includes a plurality of dummy trench portions 30. Each of the dummy trench portions 30 in the FWD region 70 includes two longitudinal portions and one lateral portion. In the present example, the longitudinal portions extend parallel to extending directions of the contact portions 54. In FIG. 2, the two longitudinal portions and one lateral portion of each of the dummy trench portions 30 form an inverted U shape. The two longitudinal portions may face with each other in the X-axis direction and extend individually in the Y-axis direction. The lateral portion may connect the two longitudinal portions at an end in the Y-axis direction. In the present example, the longitudinal portions of the dummy trench portions 30 are arrayed at a predetermined interval in the X-axis direction. Therefore, each mesa region 60-1 in the present example has the same width in the X-axis direction.

The IGBT region 80 of the present example includes a plurality of dummy trench portions 30 and a plurality of gate trench portions 40. Each of the gate trench portions 40 also has two longitudinal portions and one lateral portion. In FIG. 2, the two longitudinal portions and one lateral portion of each of the gate trench portions 40 form an inverted U shape. The two longitudinal portions may face each other in the X-axis direction and extend individually in the Y-axis direction. The lateral portion may connect the two longitudinal portions at an end in the Y-axis direction.

In the present example, the longitudinal portions of the gate trench portions 40 are arrayed at a pitch twice a pitch of the longitudinal portions of the dummy trench portions 30 in the FWD region 70 in the X-axis direction. In the IGBT region 80, two longitudinal portions of a dummy trench portion 30 are present between two longitudinal portions of two gate trench portions 40 adjacent in the X-axis direction.

In the IGBT region 80 of the present example, a distance between a longitudinal portion of a dummy trench portion 30 and a longitudinal portion of a gate trench portion 40 in the X-axis direction is equal to a distance between two longitudinal portions of two dummy trench portions 30 adjacent in the X-axis direction. In the present example, a width of each of the mesa regions 60-1, mesa regions 60-2 and the boundary mesa region 61 in the X-axis direction is 2.3 μm.

In the present example, the longitudinal portions of the gate trench portions 40 are longer than the longitudinal portions of the dummy trench portion 30 in the Y-axis direction. The gate trench portions 40 reach below the gate runner portion 110 in the Y-axis direction. The lateral portions of the gate trench portions 40 are located below the gate runner layer 46 for the electrical connection to the gate runner layer 46. On the other hand, the dummy trench portions 30 do not reach the gate runner portion 110 in the Y-axis direction. In the present example, bottoms of the lateral portions of the gate trench portions 40 and the dummy trench portions 30 are covered by a well region 17. The well region 17 also covers a bottom of a part of a longitudinal portion located in the vicinity of a lateral portion of each trench portion.

The (P+)-type contact region 15 may have a higher P-type dopant concentration than the anode region 13 or the base region 14. The contact region 15 may function as a low resistance path for holes when the holes are extracted from the semiconductor substrate 10 to the emitter electrode 50. In the present example, contact regions 15 in the FWD region 70 are connected to first contact portions 54-1 on the mesa regions 60-1. Similarly, contact regions 15 in the IGBO region 80 are also connected to the second contact portions 54-2 on the mesa regions 60-2.

A (P+)-type well region 17 may be provided below the gate runner portion 110. The well region 17 of the present example is provided from an outer end 94 of the gate runner portion 110 to an inner end 92 of the gate runner portion 110 in the Y-axis direction. In the present example, the outer end 94 is located outside an outer end of the gate runner portion 110. The inner end 92 is located between the lateral portions of the dummy trench portions 30 and the ends 55 of the contact portions 54.

The well region 17 also has a higher P-type dopant concentration than the anode region 13 or the base region 14. The well region 17 has a function of isolating the base region 14 and the anode region 13 from the vicinity of an outer peripheral end 66. The well region 17 may be exposed at the upper surface of the semiconductor substrate 10. However, in the present example, an insulating film is provided in a range corresponding to the well region 17 on the upper surface of the semiconductor substrate 10, and thus, the well region 17 is electrically isolated from the gate runner layer 46, and the connection layers 27 and 28.

An (N+)-type emitter region 12 may function as a low resistance path for electrons when the electrons are injected in the semiconductor substrate 10. In the present example, the emitter regions 12 are provided only to the mesa regions 60-2 in the IGBO region 80. The emitter region 12 or the contact region 15 located below the contact portion 54-2 is illustrated by a dashed line. To reduce the interference of a current, the emitter region 12 is not provided in the boundary mesa region 61 that is a mesa region 60-2 in contact with the FWD. region 70 in the IGBO region 80 in the present example. This can suppress electrons injected from the emitter region 12 to a drift region in the IGBO region 80 from flowing out to a cathode region 72 in the FWD. region 70. In another example, an (N+)-type region (for example, emitter region 12) may be provided in the boundary mesa region 61 or the mesa regions 60-1 in the FWD. region 70.

However, in this case, the (N+)-type region may preferably not in contact with the gate trench portions 40 although it may be in contact with the dummy trench portions 30 or the like.

Each of the mesa regions 60-2 in the IGBO region 80 includes the emitter regions 12 and the contact regions 15 that are alternately exposed at the upper surface in the Y-axis direction. The emitter regions 12 and the contact regions 15 of each mesa region 60-2 are provided across two trench portions adjacent in the X-axis direction. Each mesa region 60-2 of the present example includes a contact region 15 immediately below ends 55-2 of a contact portion 54-2. The contact region 15 located immediately below the end 55-2 may be sandwiched between a base region 14 and an emitter region 12 in the Y-axis direction.

The well region 17 and the base region 14 are provided in the boundary mesa region 61 of the IGBO region 80 in a range corresponding to a range as in the mesa regions 60-2. However, the contact region 15 is provided in the boundary mesa region 61 in a range where the well region 17 and the base region 14 are not provided. In the present example, the (P+)-type contact region 15 of the boundary mesa region 61 is mainly exposed at the upper surface in the Y-axis direction.

The well region 17 and the anode region 13 corresponding to the base region 14 are provided in each of the mesa regions 60-1 in the FWD. region 70 in a range corresponding to a range as in each mesa region 60-2. In each mesa region 60-1 also, a contact region 15 is provided immediately below an end 55-1 of a contact portion 54-1. A range of a contact region 15 in each mesa region 60-1 corresponds to a range of a contact region 15 located immediately below an end 55-2 of each mesa region 60-2 in the X-axis direction. The remaining region in each mesa region 60-1 may be the anode region 13.

In the semiconductor device 200 of the present example, both the FWD. region 70 and the IGBO region 80 have an N-type accumulation region 16. In the present example, the accumulation region 16 is provided between the anode region 13 and the base region 14, and a drift region in the depth direction of the semiconductor substrate 10. A drift region will be illustrated in FIG. 3. This enables reducing an on-voltage (Von) of an IGBO while enhancing a carrier injection enhancement effect (IE effect) in the IGBO region 80.

The accumulation region 16 may be formed by the ion implantation of N-type dopants to a predetermined depth range of the semiconductor substrate 10 via an opening region of a resist mask as in another dopant implantation region. Mask sags (edge portion of mask is deformed to gentle slope portion from right-angled shape) are caused at an open end of a resist mask, and thus, a depth range of the accumulation region 16 is likely to be deviated from a design depth at a position of the semiconductor substrate 10 corresponding to the open end. If accumulation regions 16 are provided in the IGBO region 80 and are not provided in the FWD. region 70 at all, the accumulation regions 16 are discontinuous from the IGBO region 80 to the FWD. region 70. This causes the formation of the accumulation region 16 deviated from the design depth at the portion. Therefore in the present example, accumulation regions 16 are also provided in the FWD. region 70 in addition to the IGBO region 80 to prevent affecting a characteristic of a gate threshold voltage or the like in an IGBO caused by the formation of the accumulation region 16 deviated from the design depth in the mesa regions 60-2.

The N-type accumulation region 16 has a function of accumulating holes between the accumulation region 16 and a drift region in the depth direction. Therefore, the accumulation region 16 may prevent holes from being extracted from the contact portion 54. Therefore, in the present example, an end 19 of the accumulation region 16 in the positive Y-axis direction is provided inside an end 55 of the contact portion 54 in the positive Y-axis direction. Therefore, in the present example, carriers (in the present example, holes) are easily extracted to the emitter electrode 50 through the contact portion 54. This can improve the reverse recovery withstand capability compared to when a first contact portion 54-1 and the accumulation region 16 are completely overlapped because the amount of carriers during reverse recovery in the FWD. region 70 can be reduced.

The FWD. region 70 includes a plurality of first contact portions 54-1 that are separate from one another in the X-axis direction and extend individually in the Y-axis direction. In the present example, each of the first contact portions 54-1 in the FWD. region 70 includes a first non-overlapping region 56-1 and a first overlapping region 58-1. The first non-overlapping region 56 is a region in which the first contact portion 54-1 and the accumulation region 16 in the Y-axis direction do no to overlap in the depth direction. On the other hand, the first overlapping region 58-1 is a region in which the first contact portion 54-1 and the accumulation region 16 in the Y-axis direction overlap in the depth direction.

In the present example, the (P+)-type contact region 15 is provided immediately below a first non-overlapping region 56-1 in each first contact portion 54-1. Therefore, holes are likely to be extracted to the emitter electrode 50 through the contact region 15 immediately below the first non-overlapping region 56-1. On the other hand, in the present example, instead of the contact region 15, the anode region 13 is provided immediately below the first overlapping region 58-1.

In the present example, the end 19 of the accumulation region 16 in the positive Y-axis direction is parallel to the X-axis direction. In the present example, the end 19 of the accumulation region 16 in the positive Y-axis direction is located between the end 55-1 of the contact portion 54-1 and the end 55-2 of the contact portion 54-2, and an end of the cathode region 72 (that is, lower surface side boundary 82). A length from the end 55 of the contact portion 54 to the end 19 of the accumulation region 16 in the positive Y-axis direction is, for example, several am or more to 20 am or less Therefore, it is not necessary to consider an influence on a characteristic of a gate threshold voltage or the like of an IGBO due to the accumulation region 16 deviated from the design depth.

The IGBO region 80 includes a plurality of second contact portions 54-2 that are separate from one another in the X-axis direction and extend individually in the Y-axis direction. In the present example, each of the second contact portions 54-2 in the IGBO region 80 includes a second non-overlapping region 56-2 and a second overlapping region 58-2. The second non-overlapping region 56-2 is a region in which the second contact portion 54-2 and the accumulation region 16 in the Y-axis direction do not overlap in the depth direction. On the other hand, the second overlapping region 58-2 is a region in which the second contact portion 54-2 and the accumulation region 16 in the Y-axis direction overlap in the depth direction.

In the present example, the first non-overlapping region 56-1 and the second non-overlapping region 56-2 are merely provided in the vicinity of the ends 55-1 and 55-2 of the contact portion 54 in the Y-axis direction respectively and the majority of the contact portion 54 corresponds to the first overlapping region 58-1 and the second overlapping region 58-2. Therefore, a sufficient IE effect can be obtained in the IGBO region 80 while improving the reverse recovery withstands capability in the FWD. region 70.

A gate metal layer 48 may be electrically connected to a gate runner layer 46 via a contact portion 47. The gate runner layer 46 may be a conductive layer made of poly-silicon having dopants. The gate runner layer 46 may be formed in processes of forming a gate conductive portion, a dummy trench conductive portion, a connection layer 27, and a connection layer 28 each being made of poly-silicon as same as the gate runner layer 46.

The emitter electrode 50 may be provided in an entire active region 100. The emitter electrode 50 of the present example is spaced apart from the gate metal layer 48 in the Y-axis direction so as not to be short-circuited with the gate metal layer 48. The emitter electrode 50 may be electrically connected to one or more of the emitter region 12, the anode region 13, the base region 14, and the contact region 15 in the mesa region 60 through the contact portion 54. The emitter electrode 50 of the present example electrically connects the anode region 13 and the contact region 15 in the FWD. region 70 via the first contact portion 54-1 and electrically connects the emitter region 12 and the contact region 15 in the IGBO region 80 via the second contact portion 54-2.

The emitter electrode 50 may be electrically connected to dummy trench conductive portions of dummy trench portions 30 via contact portions 52 and 53. The connection layers 27 and the connection layer 28 of the present example are connected to the dummy trench conductive portions of the dummy trench portions 30. However, in a region in which the connection layer 27 and the connection layer 28 do not overlap the dummy trench portions 30, an insulating film such as an oxide film is provided between the connection layer 27 and the connection layer 28, and the upper surface of the semiconductor substrate 10.

Each of the emitter electrode 50 and the gate metal layer 48 may be a metal layer. Each metal layer is made of, for example, aluminum (Al), aluminum (Al)-silicon (Si) metal alloy, or aluminum (Al)-silicon (Si)-copper (Cu) metal alloy. Each metal layer may have a barrier metal made of titanium (It), a titanium compound or the like at a layer below a region made of aluminum or the like. A plug formed of tungsten (W) or the like may be provided in the contact portions 47, 52 and 54.

FIG. 2 illustrates, with a dashed line, a range where the (N+)-type cathode region 72 exposed at the lower-surface side of the semiconductor substrate 10 is provided. In the present example, an end of the cathode region 72 in the positive Y-axis direction is provided inside the end 19 of the accumulation region 16 in the positive Y-axis direction. A length from an end of the gate runner portion 110 in the negative Y-axis direction to an end of the cathode region 72 is, for example, 50 am. A length from the end 55 of the contact portion 54 to an end of the cathode region 72 is, for example 20 am or more to 40 am or less. In the present example, an end of the cathode region 72 in the negative X-axis direction (that is, lower surface side boundary 82) matches an upper surface side boundary 74. However, to facilitate understanding, the lower surface side boundary 82 and the upper surface side boundary 74 overlapping in the Y-axis direction are illustrated by being shifted in the X-axis direction.

The end 19 of the accumulation region 16 may be closer to an end of the cathode region 72 in the positive Y-axis direction than the end 55 of the contact portion 54. The end of the cathode region 72 in the positive Y-axis direction is closer to a ring gate runner portion 112 than an extending gate runner portion 114 in the Y-axis direction and corresponds to the lower surface side boundary 82 extending parallel in the X-axis direction.

A (P+)-type collector region may be provided in an entire region other than a region where the cathode region 72 is exposed at the lower-surface side of the semiconductor substrate 10. Therefore, FIG. 2 does not illustrate a range of a collector region. A collector region of the present example is provided in an entire IGBO region 80.

Figure 3:
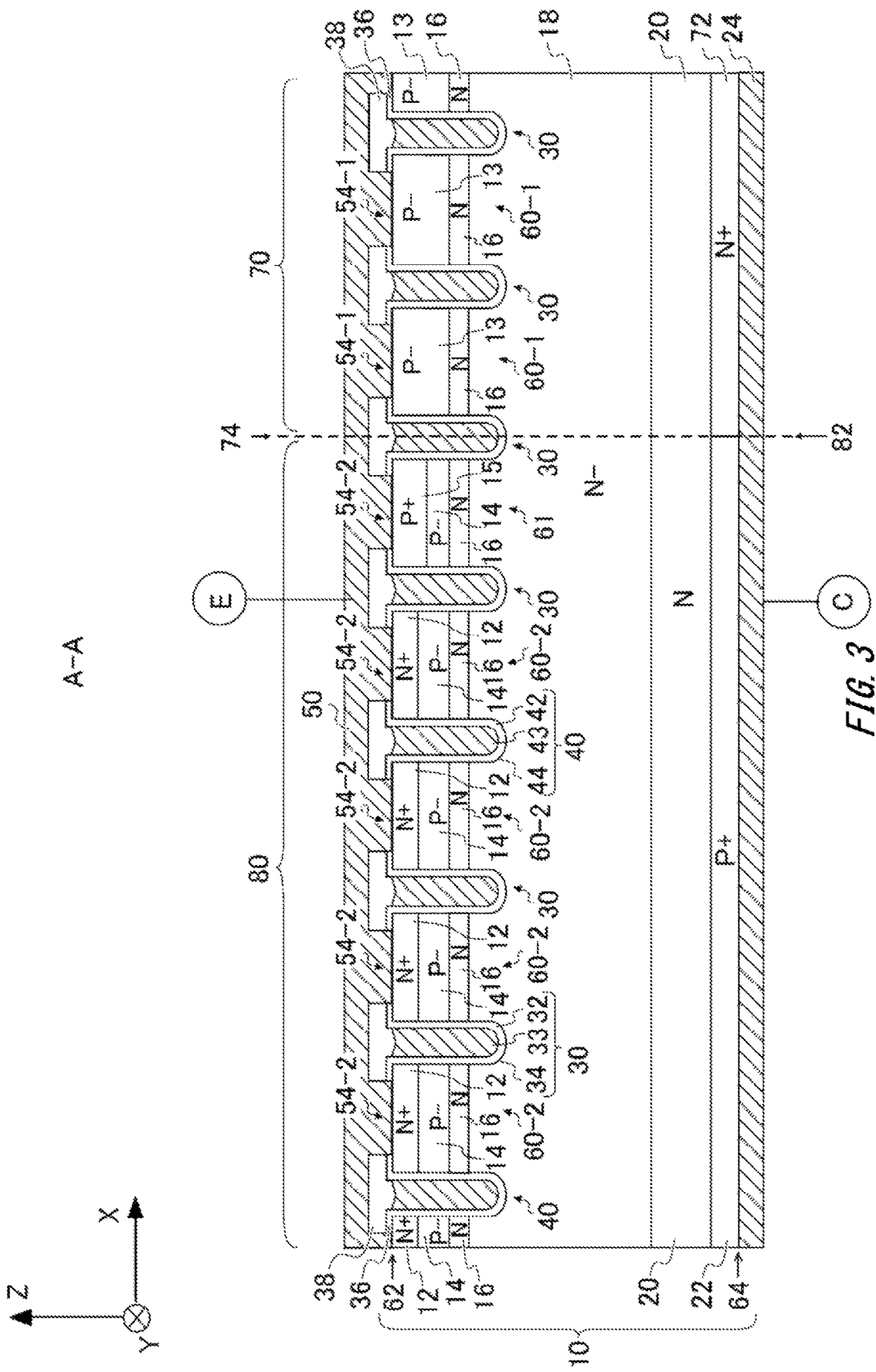
FIG. 3 illustrates an A-A cross section of FIG. 2.

FIG. 3 illustrates the A-A cross section in FIG. 2. The A-A cross section is parallel to an X-Z plane and passes through an upper surface 62 and a lower surface 64 of the semiconductor substrate 10. The A-A cross section is located closer in the negative Y-axis direction than the end of the cathode region 72 in the positive Y-axis direction and passes through the emitter region 12, the accumulation region 16, the cathode region 72 and the like. In the A-A cross section, the semiconductor substrate 10, an insulating film 36, an interlayer dielectric film 38, the emitter electrode 50, and a collector electrode 24 are illustrated.

The insulating film 36 and the interlayer dielectric film 38 of the present example are oxide films stacked above trench portions. The insulating film 36 may be a silicon dioxide ($SiO_2$) film. The insulating film 36 may be formed by the same processes as a dummy trench insulating film 32 and a gate insulating film 42 of each trench portion. The interlayer dielectric film 38 may be formed of one or more materials among BOPS (Boro-Phospho Silicate Glass), PSG (Phosphorus Silicate Glass), and BAG (Borosilicate Glass).

The emitter electrodes 50 of the present example are in contact to the upper surface 62 and the interlayer dielectric film 38 and are provided across the IGBT region 80 and the FWD region 70. The collector electrode 24 is provided over the entire lower surface 64 by being contacted with the lower surface 64. The collector electrode 24 may be made of the same materials as the emitter electrode 50.

The semiconductor substrate 10 in the A-A cross section includes dummy trench portions 30 and gate trench portions 40. The semiconductor substrate 10 in the A-A cross section includes an (N+)-type emitter region 12, a (P−)-type anode region 13, a (P−)-type base region 14, a (P+)-type contact region 15, an N-type accumulation region 16, an ((N−)-type) drift region 18, an N-type buffer region 20, a (P+)-type collector region 22, and an (N+)-type cathode region 72.

N-type, (N+)-type, and ((N−)-type) regions may be formed by the ion implantation of phosphorus (P) or arsenic (As) as a dopant. However, the buffer region 20 may be formed by the ion implantation of either one of or both of proton ($H^+$) and selenium (Se) as dopants. P-type, (P+)-type, and (P−)-type regions may be formed by the ion implantation of boron (B) as a dopant.

In the A-A cross section, each mesa region 60-2 in the IGBT region 80 includes the emitter region 12, the base region 14, and the accumulation region 16. However, the boundary mesa region 61 includes the base region 14, the contact region 15, and the accumulation region 16. The contact region 15 extends from the upper surface 62 to a position deeper than the emitter region 12. The base region 14 contacts to bottoms of the emitter region 12 and the contact region 15. The accumulation region 16 is located between the base region 14 and the drift region 18 in the depth direction of the semiconductor substrate 10. Each mesa region 60-1 in the FWD region 70 includes the anode region 13 and the accumulation region 16. The accumulation region 16 contacts to a bottom of the anode region 13. The accumulation region 16 is located between the anode region 13 and the drift region 18 in the depth direction of the semiconductor substrate 10.

Each gate trench portion 40 of the present example includes the gate insulating film 42, a gate conductive portion 43, and a gate trench 44. The gate trench 44 may be formed by selectively etching the upper surface 62. The gate insulating film 42 may contact to an inner wall of the gate trench 44. The gate insulating film 42 may be formed by oxidizing or nitriding the semiconductor on the inner wall of the gate trench 44. The gate conductive portion 43 of the present example is provided inside the gate insulating film 42 by being contacted to the gate insulating film 42. The gate insulating film 42 may insulate the gate conductive portion 43 from the semiconductor substrate 10. The gate conductive portion 43 may be formed of a conductive material such as poly-silicon.

Each dummy trench portion 30 of the present example includes the dummy trench insulating film 32, a dummy trench conductive portion 33, and a dummy trench 34. The dummy trench insulating film 32 and the dummy trench conductive portion 33 may be formed by the same method as the gate insulating film 42 and the gate conductive portion 43. Each trench portion may reach the drift region 18 by penetrating the anode region 13, the base region 14, and the accumulation region 16.

The drift region 18 of the present example is located below the anode region 13 and the base region 14 in the semiconductor substrate 10. The drift region 18 and the buffer region 20 are provided across the FWD region 70 and the IGBT region 80. The drift region 18 and the buffer region 20 in the FWD region 70 may be regarded as cathodes in the FWD region 70 as the cathode region 72.

The buffer region 20 may be located below the drift region 18. The buffer region 20 of the present example is located between the drift region 18, and the collector region 22 and the cathode region 72 in the Z-axis direction. The buffer region 20 may have a function of preventing a depletion layer that extends from a bottom of the base region 14 in the IGBT region 80 to the lower surface 64 from reaching the collector region 22 when the semiconductor device 200 is turned off. The buffer region 20 may be a field stop region in which an N-type doping concentration distribution has discrete peak values in the depth direction.

The collector region 22 and the cathode region 72 may be provided in a range from the lower surface 64 of the semiconductor substrate 10 to a predetermined depth. In the present example, a position of an end of the lower surface side boundary 82 that is a boundary between the collector region 22 and the cathode region 72 in the negative X-axis direction matches a position of the upper surface side boundary 74 in the X-axis direction. Therefore, in a cross-section (the A-A cross section) parallel to the X-Z plane inside an end of the cathode region 72 in the positive Y-axis direction, the collector region 22 is provided on the lower surface 64 side in the IGBT region 80 and the cathode region 72 is provided on the lower surface 64 side in the FWD region 70. The collector region 22 and the cathode region 72 are provided below the buffer region 20. However, an end of the cathode region 72 in the negative X-axis direction (lower surface side boundary 82) may be retracted to the FWD region 70 side without matching the upper surface side boundary 74. In this case, in a cross-section parallel to the X-Z plane inside an end of the cathode region 72 in the positive Y-axis direction, the collector region 22 is provided on the lower surface 64 side in the IGBT region 80 and the collector region 22 and the cathode region 72 are provided on the lower surface 64 side in the FWD region 70. An end of the cathode region 72 in the negative X-axis direction may extend in the IGBT region 80 side. In this case, in a cross-section parallel to the X-Z plane inside an end of the cathode region 72 in the positive Y-axis direction, the collector region 22 and the cathode region 72 are provided on the lower surface 64 side in the IGBT region 80 and the cathode region 72 is provided on the lower surface 64 side in the FWD region 70.

The IGBT region 80 of the present example includes the upper surface side boundary 74 in the positive X-axis direction. The IGBT region 80 may have the upper surface side boundary 74 with the FWD region 70 in the negative X-axis direction also. In the present example, a range of the IGBT region 80 in the X-axis direction corresponds to a range between two adjacent upper surface side boundaries 74. The FWD region 70 corresponds to a region other than the IGBT region 80 in the active region 100.

Figure 4:
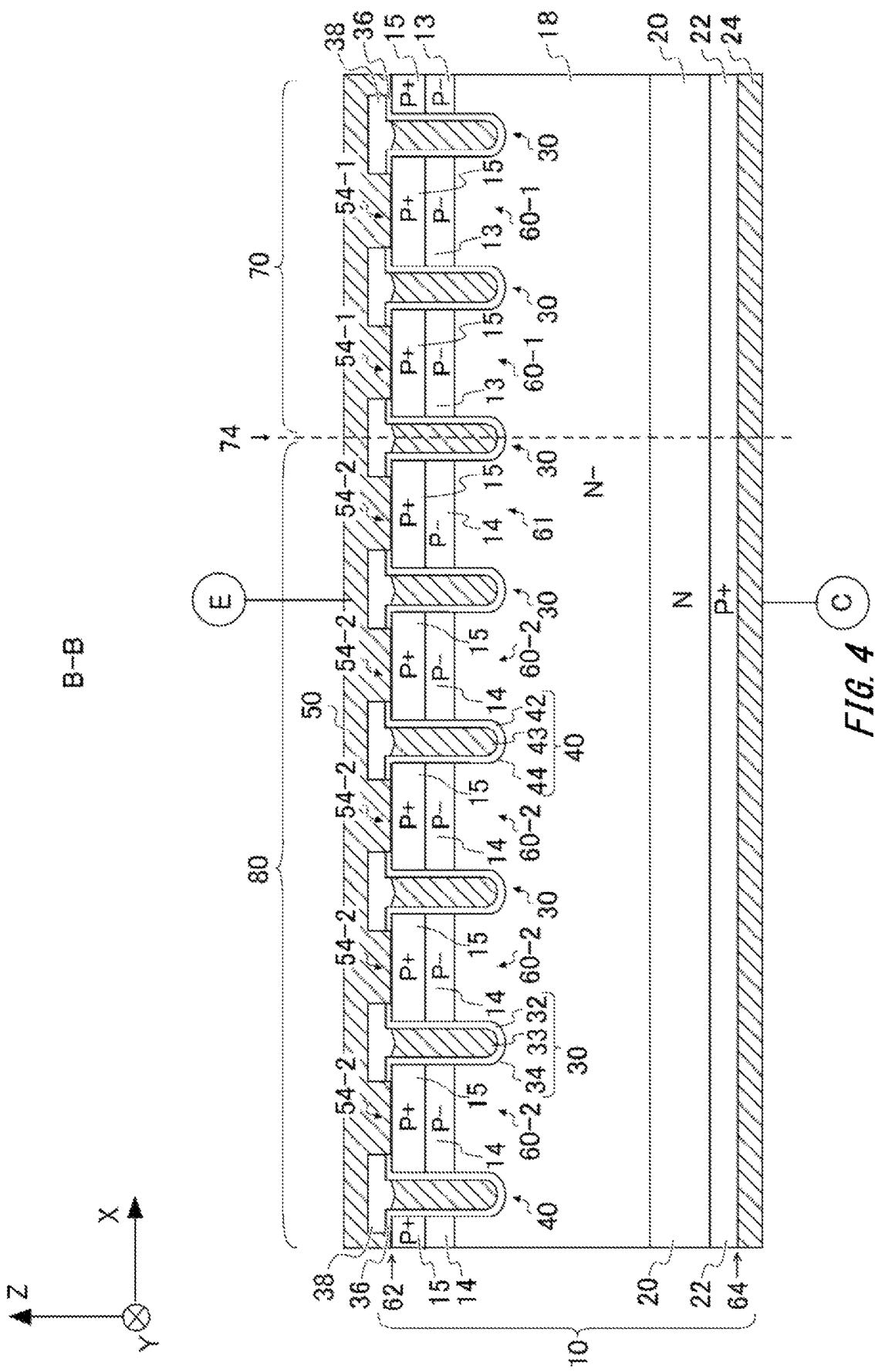
FIG. 4 illustrates a B-B cross section of FIG. 2.

FIG. 4 illustrates the B-B cross section in FIG. 2. The B-B cross section is parallel to the X-Z plane and passes through the end 55 of the contact portion 54 and the end 19 of the accumulation region 16 in the Y-axis direction. The B-B cross section passes through the contact regions 15 in the FWD region 70 and the IGBT region 80. The B-B cross section is located closer in the positive Y-axis direction than the end of the cathode region 72 in the positive Y-axis direction. Therefore, the B-B cross section does not include the cathode region 72 and the lower surface side boundary 82.

Figure 5:
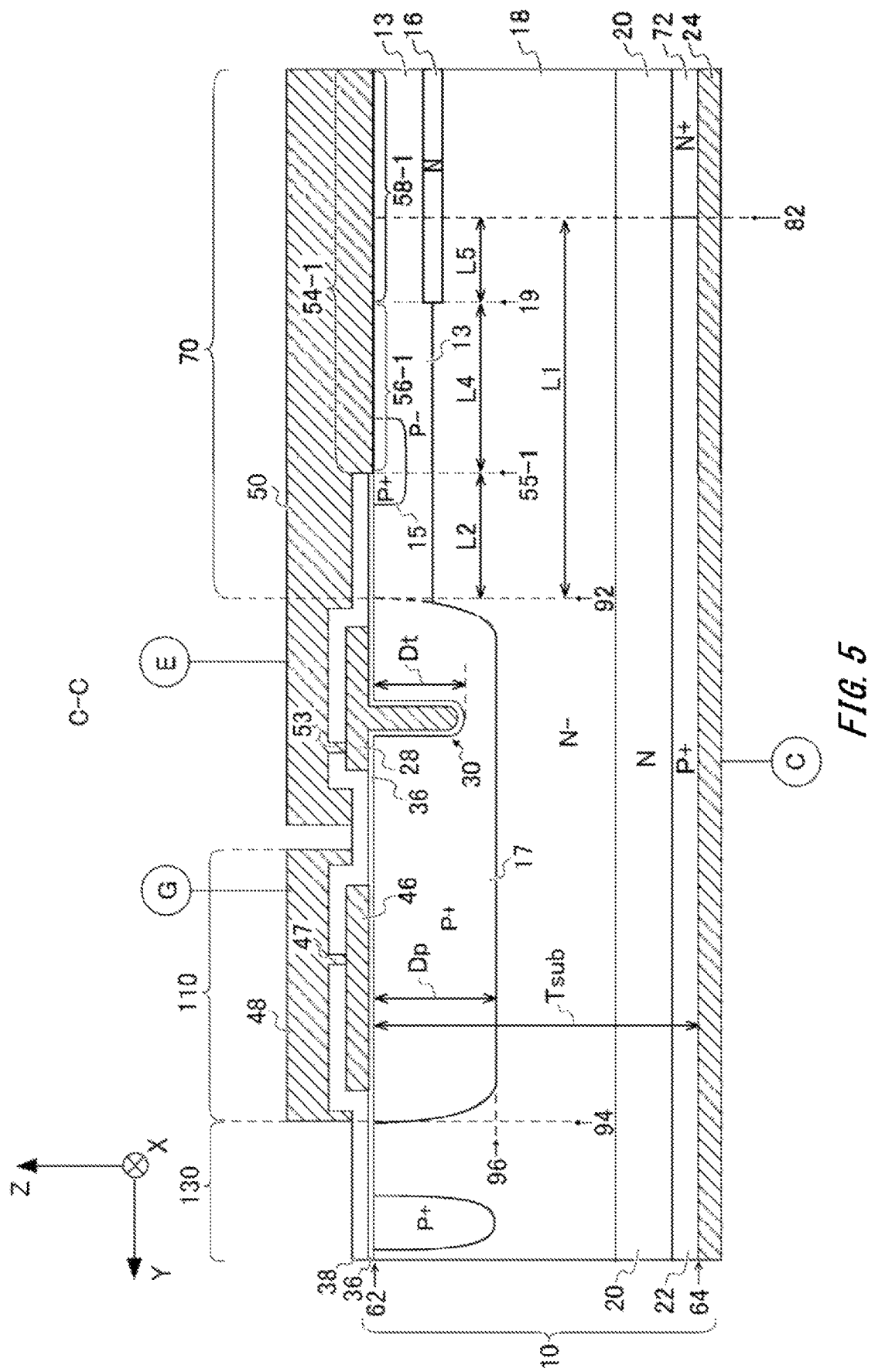
FIG. 5 illustrates a C-C cross section of FIG. 2.

FIG. 5 illustrates the C-C cross section in FIG. 2. The C-C cross section is parallel to the Y-Z plane and passes through the FWD region 70 and the gate runner portion 110. Particularly, the C-C cross section passes through the first contact portions 54-1 in the FWD region 70. A well region 17 below the gate runner portion 110 may contact to the FWD region 70 in the Y-axis direction. In the C-C cross section, the inner end 92 is an end of the well region 17 opposite the edge termination region 130 in the Y-axis direction.

In the present specification, a range more inside than the inner end 92 of the well region 17 is defined as the FWD region 70. A well region 17 is also provided below the extending gate runner portion 114. The FWD region 70 may be regarded as a range sandwiched between a well region 17 below the ring gate runner portion 112 and the well region 17 below the extending gate runner portion 114 in the Y-axis direction.

In the C-C cross section, positions of the inner end 92 of the well region 17, the end 55-1 of the first contact portions 54-1, the end 19 of the accumulation region 16, and an end of the cathode region 72 (that is, lower surface side boundary 82) are illustrated with a dashed line by projecting them on the upper surface 62. As illustrated in the figure, the inner end 92 of the well region 17, the lower surface side boundary 82 corresponding to an end of the cathode region 72, the end 19 of the accumulation region 16, and the end 55 of the contact portion 54 face with one another in the Y-axis direction.

Holes may be accumulated in the well region 17. For example, holes injected from the collector region 22 to the drift region 18 in the IGBT region 80 during operation of an IGBT may be accumulated in the vicinity of a bottom 96 of the well region 17 adjacent the IGBT region 80.

During forward direction operation of the FWD region 70, hole currents flow from the anode region 13 to the lower surface 64. This enables partial holes supplied to the drift region 18 to flow to the lower surface 64 as hole currents so that holes may be accumulated in the vicinity of the bottom 96 of the well region 17. However, in the present example, the lower surface side boundary 82 is separate from the inner end 92 of the well region 17. This enables more reducing the amount of holes accumulated in the vicinity of the bottom 96 of the well region 17 adjacent to the FWD region 70 than a case where the lower surface side boundary 82 is located immediately below the inner end 92 of the well region 17.

Normally, a semiconductor module mounted with an RC-IGBT includes upper RC-IGBTs configuring an upper arm and a lower RC-IGBT configuring a lower arm, the upper arm and the lower arm being connected in in series. Each of the upper RC-IGBT and the lower RC-IGBT is turned on or turned off depending on an operational mode. Due to the operation, the FWD region 70 of an RC-IGBT is in a reverse recovery state after being in a forward direction state for a predetermined time period. In the reverse recovery state, currents flow in a direction opposite forward direction currents. That is, in the reverse recovery state, holes substantially flow in a direction from the lower surface 64 to the upper surface 62. Particularly, holes accumulated in the vicinity of the bottom 96 of the well region 17 may be extracted from the first contact portions 54-1 when the FWD region 70 is in the reverse recovery state. At this time, holes tend to concentrate in the vicinity of the end 55-1 of the first contact portions 54-1. The destructive breakdown withstand capability of the FWD region 70 is likely to be decreased by hole currents being concentrated in the vicinity of the end 55-1 during reverse recovery.

Therefore, in the present example, the lower surface side boundary 82 is retracted from the inner end 92 of the well region 17. This enables reducing the amount of holes accumulated in the vicinity of the bottom 96 of the well region 17 so as to reduce the concentration of hole currents in the vicinity of the end 55-1 of the first contact portions 54-1. In the present example, the shortest distance when the inner end 92 of the well region 17 and the lower surface side boundary 82 are projected on the upper surface 62 is defined as a first distance L1. The first distance L1 may be larger than a depth Dp from the upper surface 62 of the semiconductor substrate 10 to the bottom 96 of the well region 17 and may be smaller than a thickness Tsub from the upper surface 62 to the lower surface 64 of the semiconductor substrate 10.

The depth Dp may be larger than a depth Dt from the upper surface 62 to a bottom of a trench portion and may be smaller than a half of the thickness Tsub of the semiconductor substrate 10. For example, the depth Dp is 10 μm or more to 20 μm or less. The thickness Tsub of the semiconductor substrate 10 is, for example, 100 μm or more to 200 μm or less although it can be determined depending on a breakdown voltage. The thickness Tsub of the present example is 110 μm.

The end 55-1 of the first contact portion 54-1 may be separated from the inner end 92 of the well region 17 because holes are likely to be concentrated in the vicinity of the end 55-1 of the first contact portion 54-1. This causes holes to move in the anode region 13 having a higher resistance than the well region 17 from the bottom 96 to the vicinity of the end 55-1. Therefore, the concentration of holes in the vicinity of the end 55-1 can be more reduced than a case where the end 55 and the inner end 92 match in the Y-axis direction. This can prevent the decrease of the destructive breakdown withstand capability in the FWD region 70.

In the present example, the end 55-1 of the first contact portion 54-1 is located between the inner end 92 of the well region 17 and the lower surface side boundary 82. More specifically, the end 55-1 is located between the inner end 92 and the end 19 of the accumulation region 16. A second distance L2 that is the shortest distance when the inner end 92 of the well region 17 and the end 55-1 of the first contact portion 54-1 are projected on the upper surface 62 may be smaller than the first distance L1. In other words, the first distance L1 may be larger than the second distance L2. The second distance L2 may be 40% or more to 60% or less of the first distance L1 and may be smaller than the half of the first distance L1. For example, the second distance L2 is several μm or more to 10 μm or less and the first distance L1 is tens of μm or more to 50 μm or less.

A fourth distance L4 that is the shortest distance when the end 55-1 of the first contact portion 54-1 and the end 19 of the accumulation region 16 are projected on the upper surface 62 may be larger than a fifth distance L5 that is the shortest distance when the end 19 of the accumulation region 16 and the end of the cathode region 72 are projected on the upper surface 62. This enables preventing the prevention of the extraction of holes from the contact portion 54 by the accumulation region 16 and facilitating the extraction of carriers (in the present example, holes) to the emitter electrode 50 through the contact portion 54. The second distance L2 may be larger than the fifth distance L5. This enables reducing the concentration of hole currents in the vicinity of the end 55-1 of the first contact portion 54-1 and ensuring the destructive breakdown withstand capability.

Figure 6A:
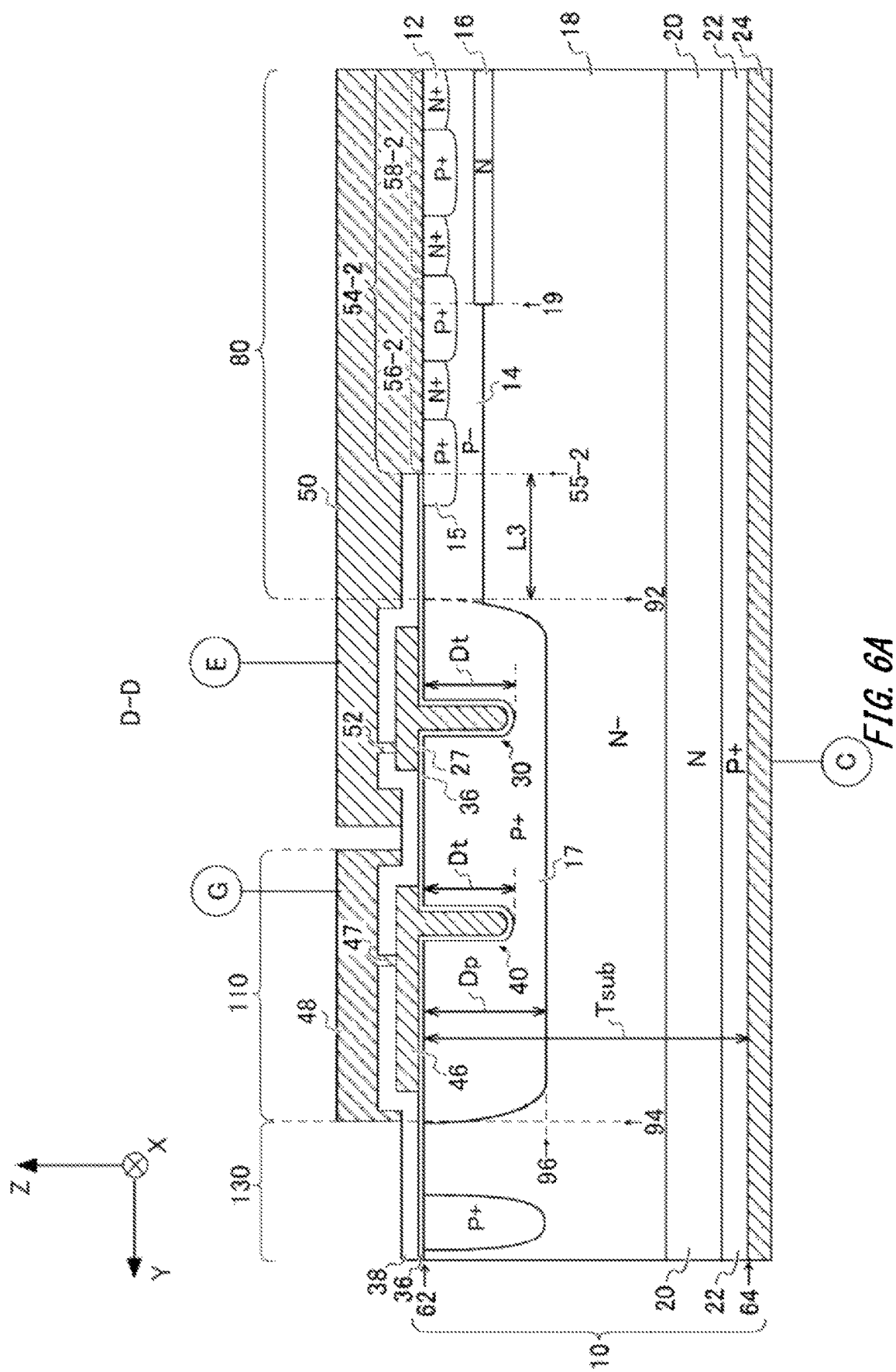
FIG. 6A illustrates a D-D cross section of FIG. 2.

FIG. 6A illustrates the D-D cross section in FIG. 2. The D-D cross section is parallel to the Y-Z plane and passes through the IGBT region 80 and the gate runner portion 110. The D-D cross section passes through, particularly, the second contact portion 54-2 in the IGBT region 80. The well region 17 may contact to the IGBT region 80 in the Y-axis direction. In the present specification, a range inside the inner end 92 of the well region 17 is defined as the IGBT region 80. A range sandwiched between a well region 17 below the ring gate runner portion 112 and a well region 17 below the extending gate runner portion 114 in the Y-axis direction may be regarded as the IGBT region 80.

The D-D cross section passes through a lateral portion of a gate trench portion 40 and a lateral portion of a dummy trench portion 30. Therefore, in the D-D cross section, the gate trench portion 40 and the dummy trench portion 30 are present in the well region 17. In the D-D cross section, positions of the inner end 92 of the well region 17 and the end 55-2 of the second contact portion 54-2 are illustrated with a dashed line by projecting them on the upper surface 62. The shortest distance in a case where the inner end 92 and the end 55-2 are projected on the upper surface 62 is defined as a third distance L3. In the present example, the third distance L3 is equal to the second distance L2, but in another example, the third distance L3 may be smaller than the second distance L2. The collector region 22 is provided on the lower surface 64 side in the IGBT region 80 instead of the cathode region 72.

Figure 6B:
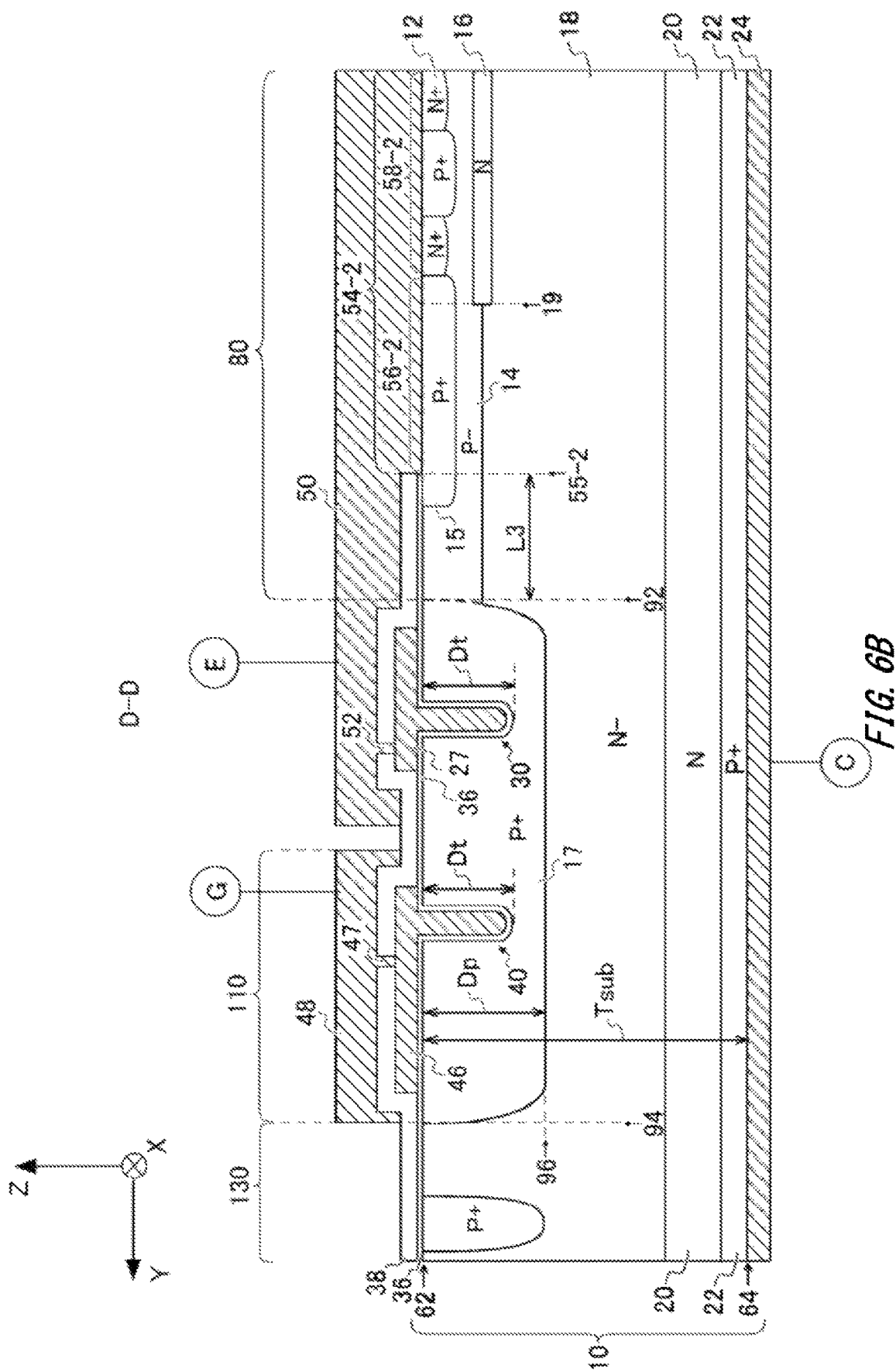
FIG. 6B illustrates another example of the D-D cross section.

FIG. 6B illustrates another example of the D-D cross section. In the present example, the accumulation region 16 is closer to the well region 17 side than an outermost emitter region 12 in the Y-axis direction (that is, an emitter region 12 closest to the well region 17). Other configurations are the same as those described in examples of FIG. 6A. This enables providing accumulation regions 16 below all emitter regions 12.

Figure 7:
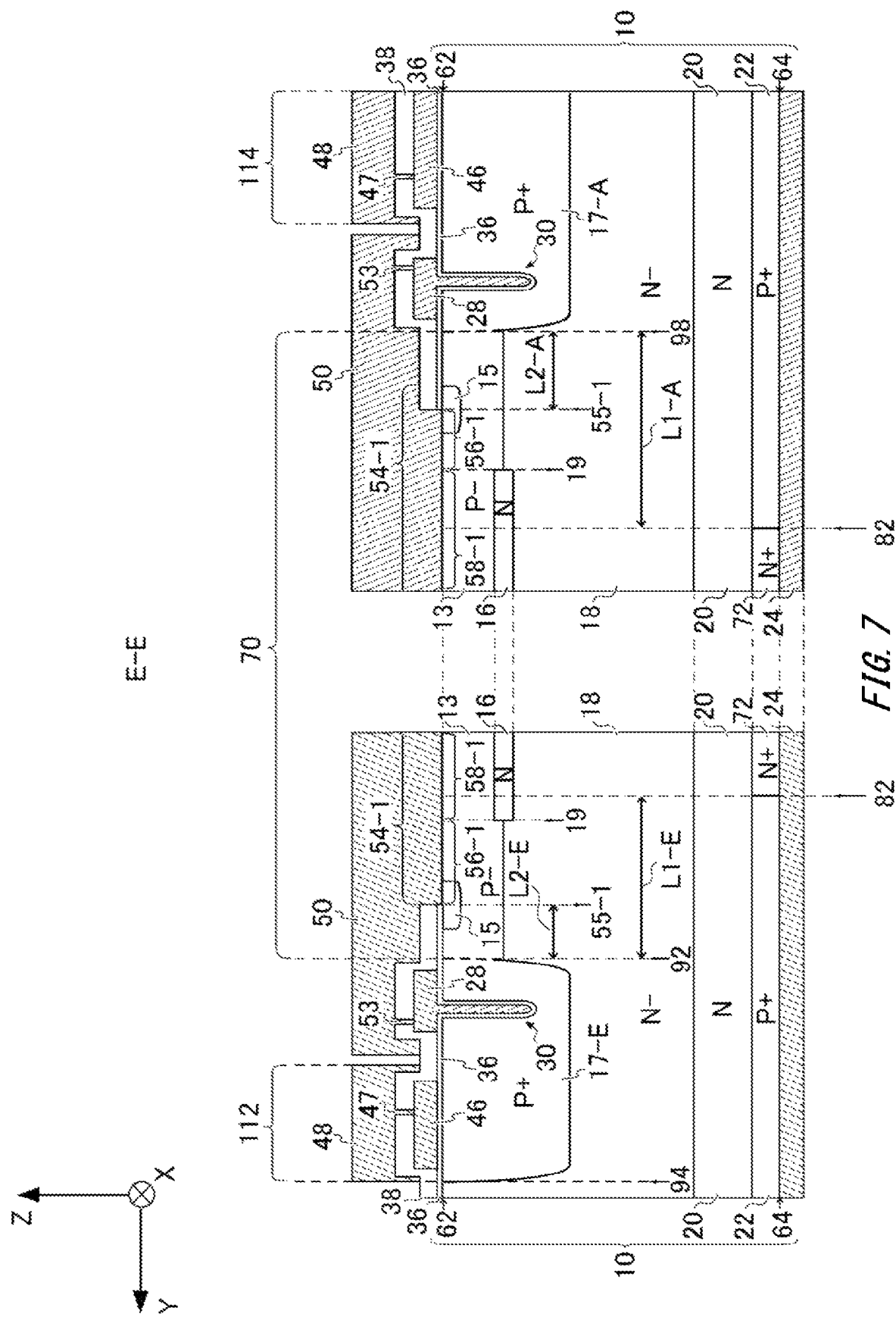
FIG. 7 illustrates an E-E cross section of FIG. 1.

FIG. 7 illustrates the E-E cross section in FIG. 1. The E-E cross section is parallel to the Y-Z plane and passes through the ring gate runner portion 112, the FWD region 70, and the extending gate runner portion 114. The E-E cross section passes through, particularly, the first contact portion 54-1 in the FWD region 70 of the active region 100-1.

To facilitate understanding, in the E-E cross section, a reference numeral 17-A is denoted to a well region 17 below the extending gate runner portion 114 and a reference numeral 17-E is denoted to a well region 17 below the ring gate runner portion 112. Reference numerals L1-A and L2-A are respectively denoted to a first distance L1 and a second distance L2 defined by the well region 17-A. That is, a reference numeral L1-A is denoted to the shortest distance in a case where an end 98 of the well region 17-A and the lower surface side boundary 82 in the positive Y-axis direction are projected on the upper surface 62 and a reference numeral L2-A is denoted to the shortest distance in a case where the end 98 of the well region 17-A and the end 55-1 of the contact portion 54-1 in the negative Y-axis direction are projected on the upper surface 62. Similarly, reference numerals L1-E and L2-E are respectively denoted to a first distance L1 and a second distance L2 defined by the well region 17-E.

In an RC-IGBT, the disruption due to the current crowding is more likely to occur in the FWD region 70 than in the IGBT region 80. The disruption is more likely to occur in the partial FWD region 70 in the vicinity of the extending gate runner portion 114 and in the vicinity of the ring gate runner portion 112 in contact to the edge termination region 130. The first distance L1-A in the vicinity of the extending gate runner portion 114 may be longer than the first distance L1-E in the vicinity of the ring gate runner portion 112 (L1-E<L1-A). Further, the second distance L2-A may be longer than the second distance L2-E (L2-E<L2-A). This enables preventing the disruption due to the current crowding at the end 55-1 of the first contact portion 54-1 in the vicinity of the extending gate runner portion 114 at which the disruption is relatively likely to occur.

Figure 8:
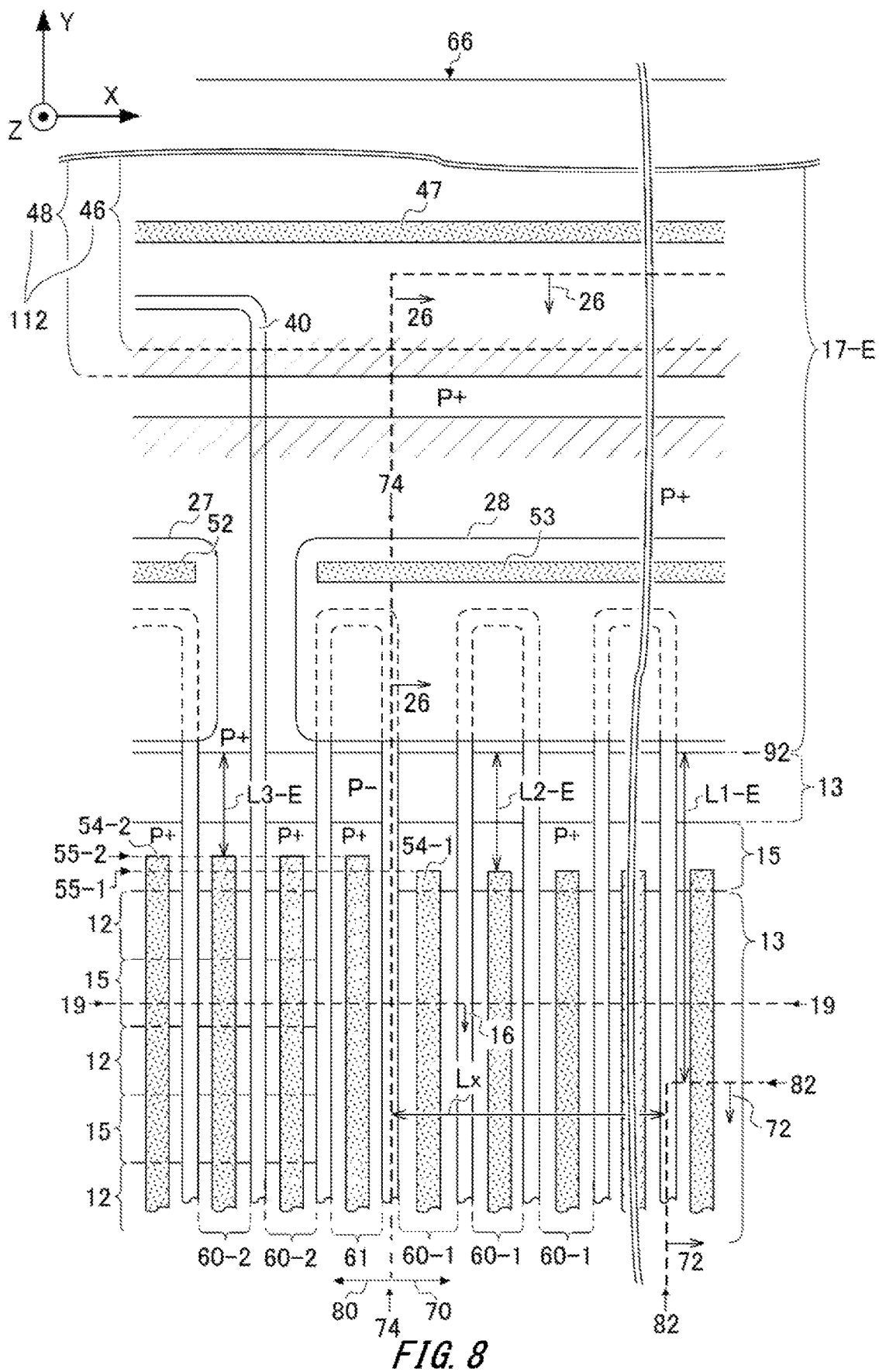
FIG. 8 is a top plan enlarged view of the vicinity of a ring gate runner portion 112 according to a first modification example.

FIG. 8 is a top plan enlarged view of the vicinity of a ring gate runner portion 112 of a first modification example. In the present example, a third distance L3-E differs from a second distance L2-E. Characteristics of a semiconductor device can be adjusted by differentiating the third distance L3-E from the second distance L2-E. As one example, the third distance L3-E is smaller than the second distance L2-E. That is, in the present example, the end 55-1 of the first contact portion 54-1 in the FWD region 70 is further separated from the well region 17-E than the end 55-2 of the second contact portion 54-2 in the IGBT region 80. This enables further widening an effective region operating as an IGBT in the IGBT region 80 than in the first embodiment while improving the destructive breakdown withstand capability in the FWD region 70. The third distance L3-E may be a half or less of the second distance L2-E and may be one-fourth or less of the second distance. An effective region operating as an IGBT can be widened more as the third distance L3-E is decreased.

The lower surface side boundary 82 of the present example is located closer to the FWD region 70 side than the upper surface side boundary 74 in the X-axis direction. That is, in the present example, an end of the cathode region 72 in the negative X-axis direction is apart from the upper surface side boundary 74 by a first retracted length Lx. The first retracted length Lx is a length from the lower surface side boundary 82 to the upper surface side boundary 74 in the X-axis direction. The first retracted length Lx may be equal to or larger than the first distance L1-E from the inner end 92 of the well region 17 to an end closest to an outer peripheral end 66 of the cathode region 72 in the Y-axis direction. The first retracted length Lx of the cathode region 72 may be tens of μm or more to hundreds of μm or less. The first retracted length Lx of the present example is 100 μm. The destructive breakdown withstand capability in the FWD region 70 can be improved by retracting the cathode region 72 in the X-axis direction also in addition to the Y-axis direction. The first retracted length Lx is a length from the lower surface side boundary 82 to the upper surface side boundary 74 in the X-axis direction and the upper surface side boundary 74 is located within the active region 100. On the other hand, the first distance L1-E is a length from the inner end 92 of the well region 17 to an end closest to the outer peripheral end 66 of the cathode region 72 in the Y-axis direction and the inner end 92 of the well region 17 is located at an end of the active region 100. From a difference in positions in the active region 100, as a retraction amount, the first retracted length Lx is set to be equal to or greater than the first distance L1-E.

Further, the semiconductor substrate 10 of the present example includes a lifetime killer region 26 in the FWD region 70. The lifetime killer region 26 may be a point defect (a vacancy in multi-vacancy, a dangling bond or the like) area formed in the semiconductor substrate 10 by introducing impurities such as helium (He). The lifetime killer region 26 may include impurities themselves introduced to form the point defect. The lifetime killer region 26 may include recombination centers of the carriers that are formed in the semiconductor substrate 10 by at least one of the point defect and the impurities. This enables further reducing the number of carriers (for example, holes) per unit time during reverse recovery than a case where the lifetime killer region 26 is not provided. Therefore, the destructive breakdown withstand capability in the FWD region 70 can be improved.

The lifetime killer region 26 of the present example is provided in a wider range than the cathode region 72 when seen from above. In the present example, an end of the lifetime killer region 26 in the negative X-axis direction matches the upper surface side boundary 74. On the other hand, an end of the lifetime killer region 26 in the positive Y-axis direction is provided below the gate runner portion 110 by going beyond an end of the FWD region 70 in the positive Y-axis direction.

However, if the lifetime killer region 26 reaches the outer peripheral end 66 of the semiconductor substrate 10, leak currents are likely to flow via the lifetime killer region 26. Therefore, the lifetime killer region 26 may be provided below the ring gate runner portion 112 in correspondence with a partial length of the ring gate runner portion 112 in the Y-axis direction. In the present example, an end of the lifetime killer region 26 in the positive Y-axis direction is located between an inner end 92 and an outer end 94 of the well region 17-E. The lifetime killer region 26 of the present example may effectively reduce the concentration of holes accumulated in the well region 17-E in the first contact portion 54-1. Therefore, the destructive breakdown withstand capability in the FWD region 70 can be improved.

The lifetime killer region 26 may also be provided in the IGBT region 80 in addition to the FWD region 70. The lifetime killer region 26 may extend from the FWD region 70 in the X-axis direction and may extend to a boundary mesa region 61 or a mesa region 60-2 of the boundary mesa region 61 side in the IGBT region 80.

Figure 9:
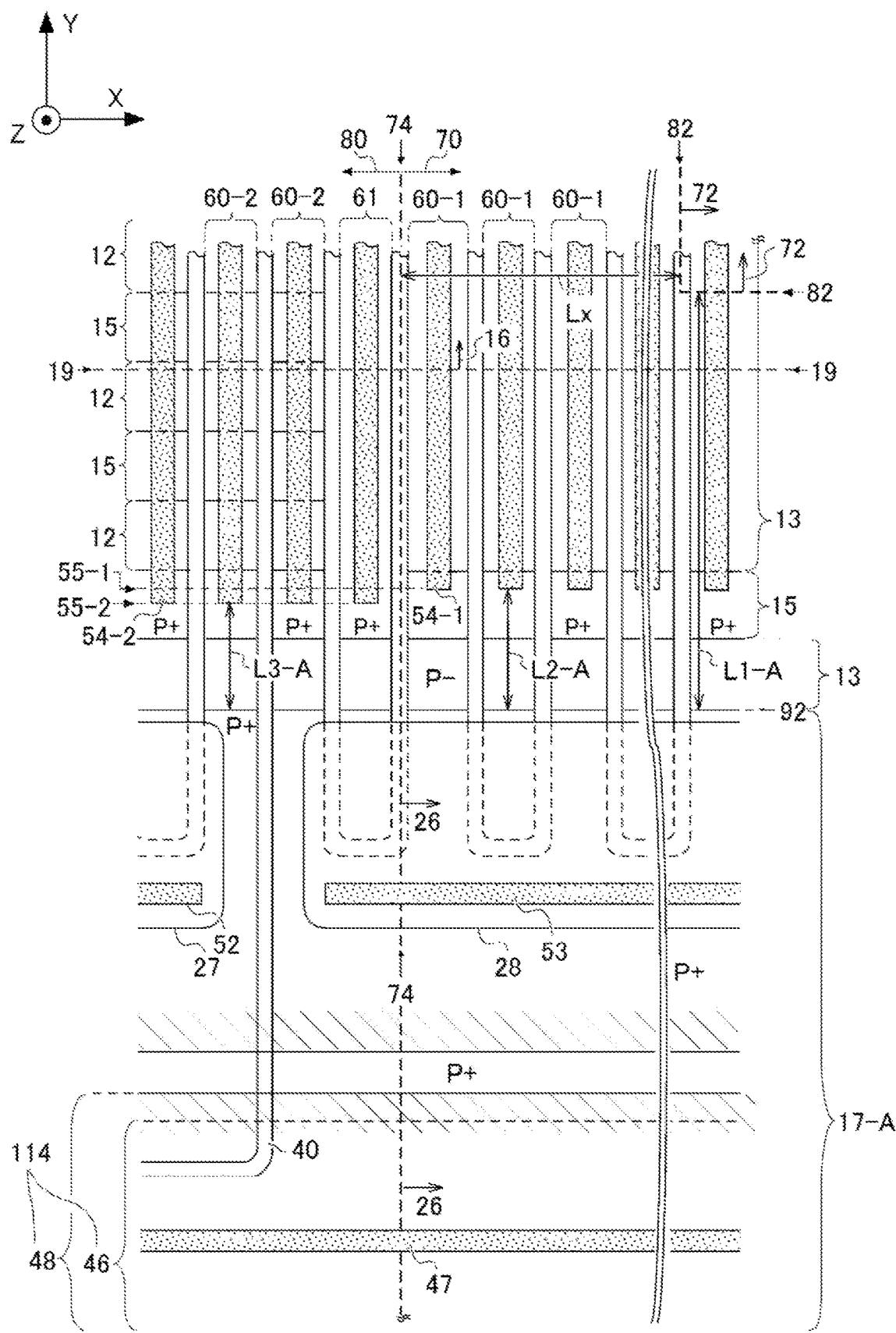
FIG. 9 is a top plan enlarged view of the vicinity of an extending gate runner portion 114 according to a first modification example.

FIG. 9 is a top plan enlarged view of the vicinity of an extending gate runner portion 114 of a first modification example. In the present example also, a third distance L3-A is smaller than a second distance L2-A. As in the examples of FIG. 8, the third distance L3-A may be a half or less of the second distance L2-A and may be one-fourth or less of the second distance L2-A. The lifetime killer region 26 may be provided over an entire length of the extending gate runner portion 114 located between active regions 100-1 and 100-2 in the Y-axis direction below the extending gate runner portion 114. This enables reducing the amount of carriers form the entire well region 17-A to the first contact portion 54-1 in a boundary region between the active regions 100-1 and 100-2 while surely preventing the leak current at the outer peripheral end 66 of the semiconductor substrate 10 in the present example.

An end 19 of the accumulation region 16 in the negative Y-axis direction may be apart from the end 55 of the contact portion 54 by several μm or more to 20 μm or less. In the present example, the end 19 of the accumulation region 16 in the negative Y-axis direction is located below a second emitter region 12 from an end in the negative Y-axis direction in the active region 100-1. The lifetime killer region 26 may overlap an entire (P+)-type well region 17 below a gate pad section 120 although not illustrated in the figure. However, the lifetime killer region 26 preferably does not reach the outer peripheral end 66 to prevent the leak current as described above. The destructive breakdown withstand capability in the FWD region 70 can be improved by the well region 17 and the lifetime killer region 26 being overlapped as much as possible in the depth direction.

Figure 10:
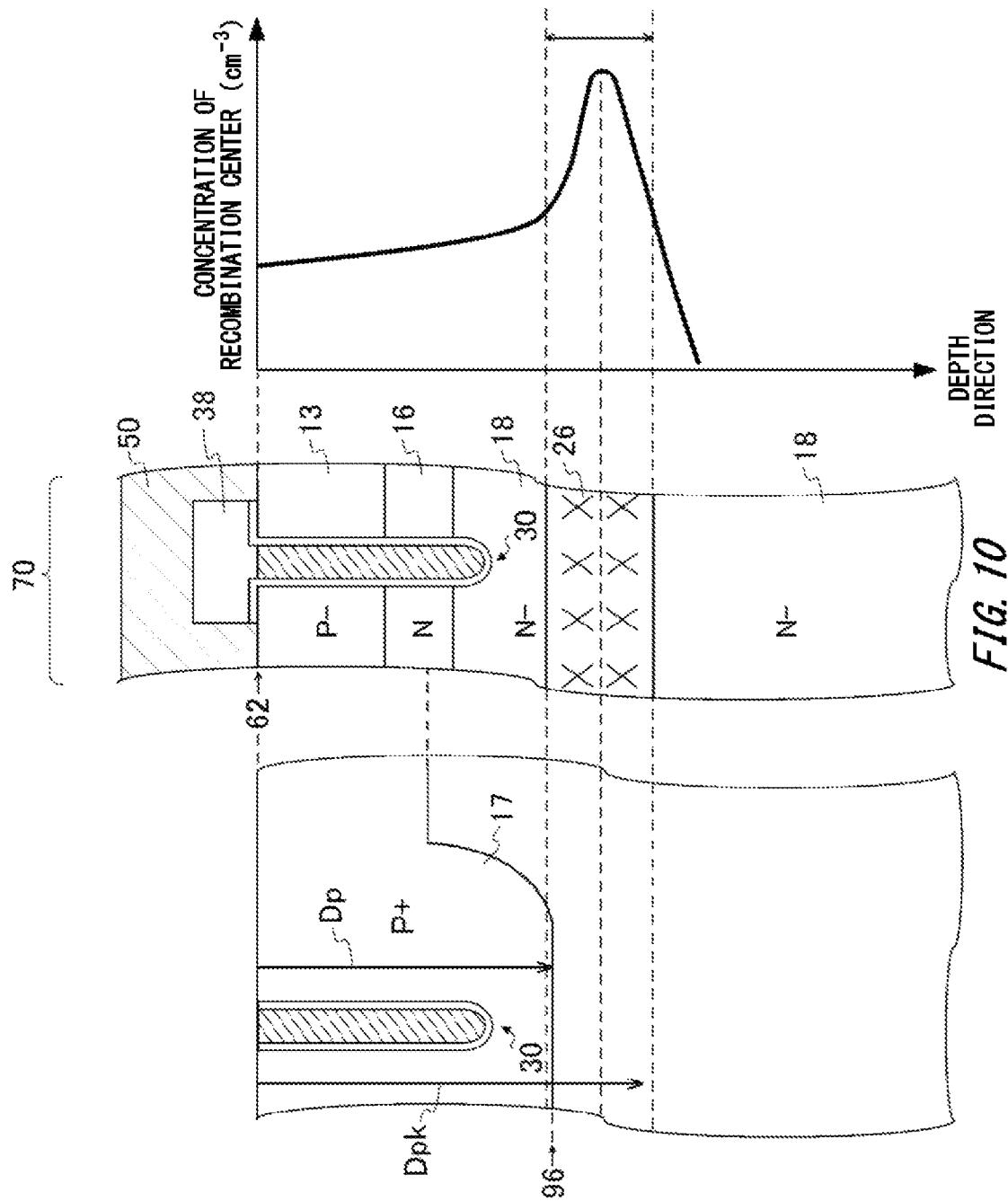
FIG. 10 illustrates the concentration distribution of recombination centers of a lifetime killer region 26 in the depth direction.

FIG. 10 illustrates the concentration distribution of recombination centers of a lifetime killer region 26 in the depth direction. FIG. 10 illustrates at the center, a part of the A-A cross section in the FWD region 70 and illustrates at a left side, a part of the C-C cross section in the FWD region 70. FIG. 10 illustrates at a right side, the concentration distribution (cm$^{-3}$) of recombination centers in the depth direction. The concentration of recombination centers may be replaced for the concentration of lifetime killers. The lifetime killer region 26 may have a concentration distribution peak of lifetime killers at a position closer to the lower surface 64 of the semiconductor substrate 10 than the bottom 96 of the well region 17 as illustrated in the figure.

It is possible to form the concentration distribution of lifetime killers in which a peak depth position Dp is 18 μm from the upper surface 62 and a half width is 10 μm by the ion implantation of He at an acceleration energy of 24 MeV from the upper surface 62. In this case, a depth Dp from the upper surface 62 to the bottom 96 of the well region 17 is, for example, 10 In this way, the amount of holes accumulated in the well region 17 when the FWD region 70 is in a forward direction state can be reduced by forming the lifetime killer region 26 at a deeper positon than the well region 17. This can improve the destructive breakdown withstand capability in the FWD region 70 during reverse recovery.

Figure 11:
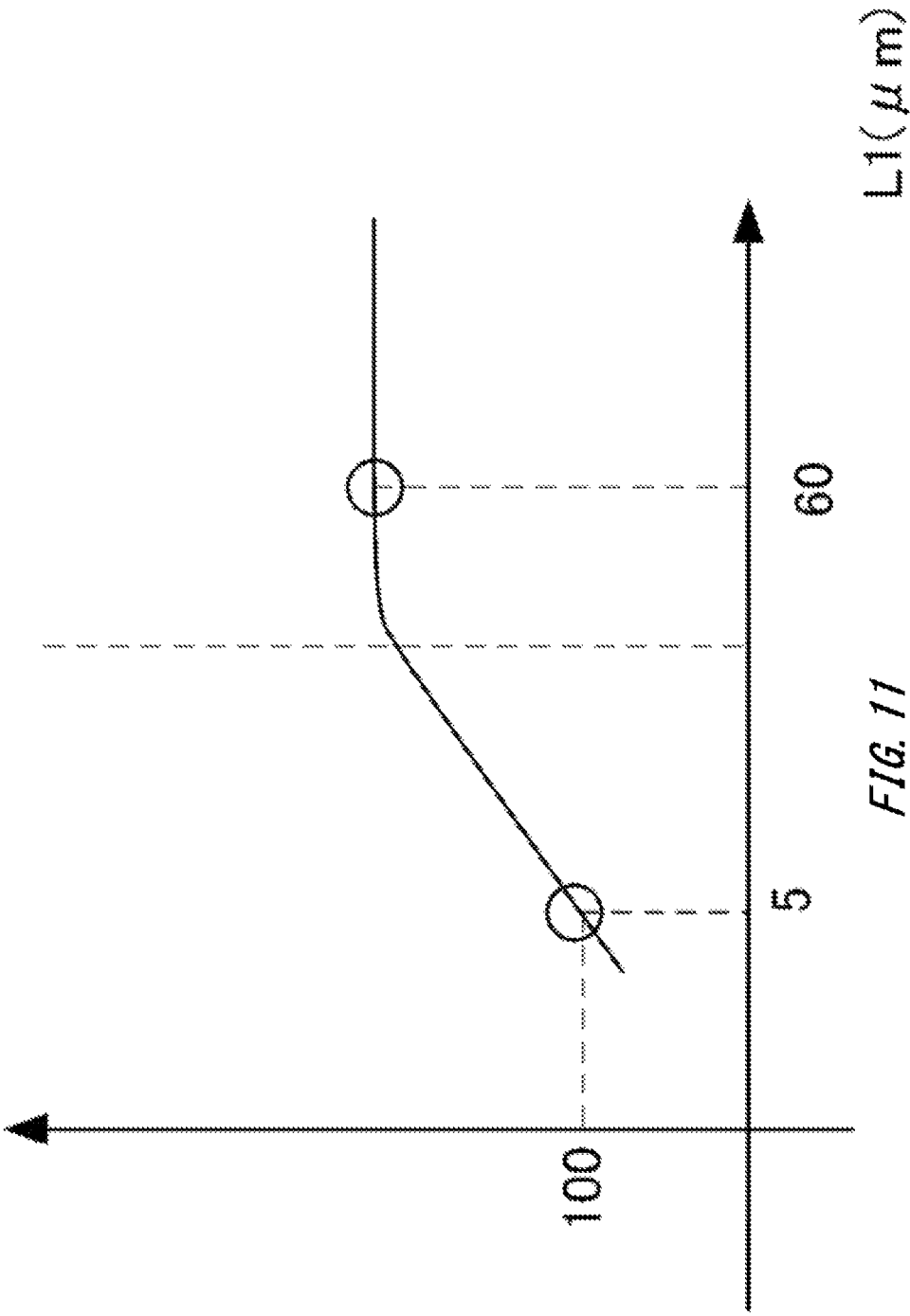
FIG. 11 illustrates the destructive breakdown withstand capability in the FWD region 70 during reverse recovery relative to the first distance L1.

FIG. 11 illustrates the destructive breakdown withstand capability in the FWD region 70 during reverse recovery relative to the first distance L1. A vertical axis represents the destructive breakdown withstand capability (kW) during reverse recovery. A horizontal axis represents a first distance L1 (μm) from the inner end 92 of the well region 17 to the lower surface side boundary 82 in the FWD region 70 (see the C-C cross section in FIG. 5). As illustrated in FIG. 11, the destructive breakdown withstand capability during reverse recovery becomes higher as the first distance L1 increases.

Table 1 shows other experimental results when a power supply voltage Vcc=800 V, a junction temperature of the semiconductor substrate 10=150° C., a thickness Tsub of the semiconductor substrate 10=110 and a width of the FWD region 70 in the X-axis direction=200 In this experiment, a reverse-recovery peak current (Irp) in which the disruption is caused in the semiconductor device 200 is measured by changing the Irp in the FWD region 70 relative to the predetermined first distance L1. In Table 1, the symbol "o" means that the semiconductor device 200 is not disrupted (non-disruption) and the symbol "x" means that the semiconductor device 200 is disrupted respectively. Two columns are provided for each of the distance L1=10 μm and the distance L1=30 μm because the measurement is performed two times for each of them. In this experiment also, the destructive breakdown withstand capability during reverse recovery becomes higher as the first distance L1 increases.

TABLE 1

| | Distance1 Distance between well region 17 and cathode region 72 | | | |
|---|---|---|---|---|
| Irp | 10 μm | | 30 μm | |
| 150 | o | o | o | o |
| 200 | o | o | o | o |
| 250 | o | o | o | o |
| 300 | o | o | o | o |
| 400 | x | o | o | o |
| 500 | | x | o | o |
| 600 | | | o | o |
| 700 | | | o | o |
| 800 | | | o | o |
| 900 | | | o | o |
| 1000 | | | o | o |
| 1100 | | | o | o |
| 1200 | | | x | x |

Each of (a) to (d) in FIG. 12 illustrates a positional relationship between the contact portion 54 and the accumulation region 16. FIG. 12 illustrates the FWD region 70 and the IGBT region 80 in the vicinity of the ring gate runner portion 112. Each of (a) to (d) in FIG. 12 illustrate at a right side, a positional relationship between the first contact portion 54-1 and the end 19 of the accumulation region 16 in the FWD region 70 and illustrates at a left side, a positional relationship between the second contact portion 54-2 and the end 19 of the accumulation region 16 in the IGBT region 80.

The (a) of FIG. 12 corresponds to the first embodiment of FIG. 2. On the other hand, in (b) to (d) of FIG. 12, positions of the end 19 of the accumulation region 16 differ depending on the FWD region 70 and the IGBT region 80. Therefore, a length of a first non-overlapping region 56-1 differs from a length of a second non-overlapping region 56-2 in the Y-axis direction. A length of a non-overlapping region 56 in the Y-axis direction corresponds to a difference between the first distance L1 and the second distance L2 illustrated in the C-C cross section.

In (b) of FIG. 12, a length of the first non-overlapping region 56-1 in the Y-axis direction is shorter than a length of the second non-overlapping region 56-2 in the Y-axis direction. On the other hand, in (c) and (d) of FIG. 12, a length of the first non-overlapping region 56-1 in the Y-axis direction is longer than a length of the second non-overlapping region 56-2 in the Y-axis direction. This enables further increasing a range in the IGBT region 80 where an IE effect can be obtained while ensuring the destructive breakdown withstand capability during reverse recovery in the FWD region 70 than examples in (a) and (b).

In an example of (d) in FIG. 12, the IGBT region 80 is an IGBT region 80-C corresponding to an inner transistor region. The end 19 of the accumulation region 16 in the IGBT region 80-C in the Y-axis direction may be closer to the outer peripheral end 66 of the semiconductor substrate 10 than the end 55-2 of the second contact portion 54-2 in the Y-axis direction. In (d) of FIG. 12, the accumulation region 16 is provided in a wider range than the second contact portion 54-2. This enables obtaining a higher IE effect in the IGBT region 80 than examples of (c) in FIG. 12.

FIG. 13 is an enlarged view of the region B in FIG. 1. The region B includes the vicinity of ends of an IGBT region 80-R in the positive X-axis direction and the positive Y-axis direction. In FIG. 13, reference numerals 54-2a to 54-2d are denoted to four second contact portions 54-2 close to the outer peripheral end 66 of the semiconductor substrate 10 in the IGBT region 80-R. The second contact portion 54-2a is the closest to the outer peripheral end 66 of the semiconductor substrate 10 in the X-axis direction. The IGBT region 80-R is one example of an outer transistor region at an end of the active region 100 in the X-axis direction.

Each of the second contact portions 54-2 in the IGBT region 80-R also has a second non-overlapping region 56-2 as the IGBT region 80-C. However, in the IGBT region 80-R, a length of each of second non-overlapping regions 56-2 in the Y-axis direction is longer as each of the second contact portions 54-2 is close to the outer peripheral end 66 of the semiconductor substrate 10 in the X-axis direction.

In the present example, the accumulation region 16 in the IGBT region 80-R includes a corner portion having a curvature. In the present example, a curved portion at the end 19 of the accumulation region 16 crosses the second contact portions 54-2b, 54-2c and 54-2d. Therefore, a length of each of second non-overlapping regions 56-2 in the Y-axis direction may be a length of each of the second non-overlapping regions 56-2 in the Y-axis direction at each of ends 55-2 of each of the second contact portions 54-2 in the positive X-axis direction.

Alternatively, the length of each of the second non-overlapping regions 56-2 may be a length of each of the second non-overlapping regions 56-2 in the Y-axis direction at ends 55-2 of each of the second contact portions 54-2 in the negative X-axis direction or may be a length of each of the second non-overlapping regions 56-2 in the Y-axis direction at the center in the X-axis direction of each of the second contact portions 54-2. Based on either definition, in the present example, a length of each of the second non-overlapping regions 56-2 in the Y-axis direction becomes large from the second non-overlapping regions 56-2d to 56-2a in order.

Particularly, the entire second contact portion 54-2a does not overlap the accumulation region 16. This enables extracting holes accumulated in the well region 17 below the ring gate runner portion 112 from the second contact portion 54-2a. Therefore, the amount of holes going around from the IGBT region 80 into the FWD region 70 can be further reduced than a case where the second contact portion 54-2a and the accumulation region 16 are overlapped in the Z-axis direction.

FIG. 14 is an enlarged view of the region A in FIG. 1 of a second embodiment. In the FWD region 70 of the present example, at least one mesa region 60-1 does not include a (P+)-type contact region 15 at a position where an end 55-1 of each of first contact portions 54-1 in the Y-axis direction and each of mesa regions 60-1 overlap. The present example differs from the first embodiment in this point. The remaining points are the same as the first embodiment and a modification example thereof. Particularly, in the present example, all mesa regions 60-1 in the FWD region 70 do not include (P+)-type contact regions 15 below the end 55-1.

In a case where a contact region 15 having a predetermined length in the Y-axis direction is provided in each of the mesa regions 60-1 as in the first embodiment, the concentration of carriers at the end 55-1 of each of the contact portions 54-1 can be prevented to some extent. However, an Irp may increase because carriers of an anode locally increase by providing a contact region 15 in each of the mesa regions 60-1. Therefore, in the present example, at least one mesa regions 60-1 does not include a contact region 15. This enables further suppressing an Irp than the first embodiment.

However, the IGBT region 80 has a parasitic thyristor structure (N-P-N-P structure). The N-P-N-P structure of the present example includes an (N+)-type emitter region 12, a (P−)-type base region 14, a (P+)-type contact region 15, an N-type accumulation region 16, an ((N−)-type) drift region 18, an N-type buffer region 20, and a (P+)-type collector region 22. If the (P+)-type contact region 15 is set as the (P−)-type base region 14, a problem arises that a latch-up is likely to be caused.

Therefore, in the IGBT region 80 of the present example, a contact region 15 located in the vicinity of an end of each of the mesa regions 60-2 in the positive Y-axis direction is left on purpose. That is, in the IGBT region 80 of the present example, at least one mesa regions 60-2 includes a contact region 15 at a position where the end 55-2 of each of the second contact portions 54-2 in the Y-axis direction and at least one mesa regions 60-2 overlap. Particularly, in the present example, all mesa regions 60-2 in the IGBT region 80 have (P+)-type contact regions 15 below the end 55-2. This can suppress the occurrence of the latch-up in an IGBT region.

FIG. 15 shows simulation results of the variation over time of an anode-cathode voltage ($V_{AK}$) and the current ($I_F$) in the FWD region 70. A vertical axis represents the anode-cathode voltage ($V_{AK}$) and the current ($I_F$). A horizontal axis represents time. Descriptions are made below by setting a plurality of FWD regions 70 in an RC-IGBT collectively as an FWD that is a functional element and samely by setting a plurality of IGBT regions 80 collectively as an IGBT that is a functional element. An emitter electrode 50 of the IGBT is common with an anode electrode in the FWD and a collector electrode 24 in the IGBT is common with a cathode electrode in the FWD.

During a time period from a time T0 to T1, the freewheeling current flows in the FWD in a forward direction (a direction form an anode to a cathode). Subsequently, at time T2, the $I_F$ in the FWD starts to be in a reverse recovery state, and at time T3, the $I_F$ in the FWD becomes an Irp. Subsequently, at time T4, the $I_F$ gradually approaches almost zero and at time T5, becomes zero. FIG. 15 illustrates an $I_F$ in the first embodiment with a dashed line and illustrates the $I_F$ in the second embodiment with a solid line. The second embodiment can suppress the Irp further than the first embodiment. The $V_{AK}$ during a time period from a time T0 to T5 is the same both in the first embodiment (dashed line) and the second embodiment (solid line).

FIG. 16 is an enlarged view of the region A in FIG. 1 of a third embodiment. For easy viewing of the figure, FIG. 16 does not illustrate the accumulation region 16 and the cathode region 72 in FIG. 2, but the accumulation region 16 and the cathode region 72 illustrated in the above-described embodiment and modification examples can be appropriately applied. In the present example, a boundary mesa region 61 in the IGBT region 80 includes a base region 14 instead of a contact region 15. That is, a (P−)-type base region 14 surrounds the X axis direction and the Y-axis direction of the FWD region 70. The structure can further reduce the amount of holes moving from the IGBT region 80 to the FWD region 70 than the second embodiment. Therefore, the destructive breakdown withstand capability in the FWD region 70 during reverse recovery can be further improved than the second embodiment.

However, each of mesa regions 60-1 in the FWD region 70 in contact with the IGBT region 80 may include a contact region 15 at a position where the end 55-1 of each of contact portions 54-1 and each of the mesa regions 60-1 overlap. In the present example, first to third mesa regions 60-1 close to the IGBT region 80 in the FWD region 70 have contact regions 15. Therefore, compared to a case where no contact region 15 is provided in the mesa regions 60-1, the amount of holes in the FWD region 70 during reverse recovery can be reduced because holes can be extracted to an emitter electrode 50 by the three mesa regions 60-1 in the vicinity of an upper surface side boundary 74.

However, at least one mesa regions 60-1 not in contact with the IGBT region 80 may not include a contact region 15 at a position where the end 55-1 of each of the contact portions 54-1 in the Y-axis direction and each of the mesa regions 60-1 overlap. In the present example, a contact region 15 is not provided in mesa regions 60-1 other than the first to third mesa regions 60-1 close to the IGBT region 80. This enables, in the FWD region 70, suppressing the injection of holes from the well region 17 to the FWD region 70 by mesa regions 60-1 "other than" a plurality of mesa regions 60-1 close to the IGBT region 80 while extracting holes by the plurality of mesa regions 60-1 close to the IGBT region 80. The first embodiment and modification examples thereof can be appropriately adopted in the present example also.

FIG. 17 is an enlarged view of the region A in FIG. 1 of a fourth embodiment. In the present example, each of dummy trench portions 30 in the IGBT region 80 includes a longitudinal portion only and does not include a lateral portion. That is, each of the dummy trench portions 30 in the IGBT region 80 of the present example has a linear shape. In the IGBT region 80, the dummy trench portions 30 and gate trench portions 40 are alternately provided in the X-axis direction. The present example differs from the first to third embodiments mainly by the above point. For space saving, FIG. 17 does not illustrate the accumulation region 16 and the cathode region 72. However, it is needless to say that technical ideas according to the first to third embodiments and modification examples thereof can be applied to the present example.

FIG. 18 is an enlarged view of the region A in FIG. 1 of a fifth embodiment. FIG. 18 does not illustrate a gate metal layer 48, an edge termination region 130 and the like. The fifth embodiment differs from the first to fourth embodiments in structures of second contact portions 54-2. The fifth embodiment is the same as any forms described in the first to fourth embodiments in structures of elements other than the second contact portions 54-2.

In the fifth embodiment, at least some second contact portions 54-2 extend to a position overlapping with the well region 17 when seen from above. On the other hand, all first contact portions 54-1 do not extend to a position overlapping with the well region 17 when seen from above. FIG. 18 illustrates a positional relationship among the well region 17, ends 55-1 of a plurality of first contact portions 54-1 in the Y-axis direction, and ends 55-2 of a plurality of second contact portions 54-2 in the Y-axis direction when they are imaginary projected on an upper surface of the semiconductor substrate 10. The ends 55-1 of the plurality of first contact portions 54-1 are arranged at a position not overlapping with the well region 17 and ends 55-2 of at least one of second contact portions 54-2 is arranged at a position overlapping with the well region 17.

An effective region in the IGBT region 80 can be widened by extending the second contact portions 54-2 to a position overlapping with the well region 17. The second contact portions 54-2 may be arranged so as not to overlap a gate runner portion 110 (gate runner layer 46 in FIG. 18).

All second contact portions 54-2 in the IGBT region 80 may be provided to overlap the well region 17. In another example, as illustrated in FIG. 18, one or more second contact portion 54-2 closest to the FWD region 70 among the plurality of second contact portions 54-2 may be arranged to not to overlap the well region 17. Among the second contact portions 54-2 in FIG. 18, a reference numeral 54-2$a$ is denoted to second contact portions 54-2 not overlapping with the well region 17 and a reference numeral 54-2$b$ is denoted to second contact portions 54-2 overlapping with the well region 17.

During reverse recovery in the FWD region 70, holes flow in some cases from an edge termination region 130 or the like to the FWD region 70. In the present example, second contact portions 54-2 in the vicinity of the FWD region 70 are set to be second contact portions 54-2$a$ having a relatively long third distance L3 from the well region 17. This can suppress the concentration of holes at ends of the second contact portions 54-2$a$ during reverse recovery in the FWD region 70. Therefore, the destructive breakdown withstand capability in the vicinity of the FWD region 70 can be improved.

FIG. 19 is an enlarged view of the region A in FIG. 1 of a sixth embodiment. FIG. 19 does not illustrate trench portions, a gate metal layer 48, an edge termination region 130 and the like. The sixth embodiment differs from the fifth embodiment in structures of second contact portions 54-2$a$. The sixth embodiment is the same any forms described in the fifth embodiment in in structures of elements other than the second contact portions 54-2$a$.

The second contact portions 54-2$a$ of the fifth embodiment have a constant third distance L3 with the well region 17. Third distances L3 change stepwise depending on whether a third distance L3 is a distance between the well region 17 and the second contact portions 54-2$a$ or a third distance L3 is a distance between the well region 17 and the second contact portions 54-2$b$. On the other hand, the second contact portions 54-2$a$ of the sixth embodiment have a smaller third distance L3 with the well region 17 as they are close to the second contact portions 54-2$b$ in the X-axis direction. The third distance L3 between each of the second contact portions 54-2$a$ and the well region 17 may change in two steps or more depending on how far it is from the second contact portions 54-2$b$. This structure can also suppress the concentration of holes at ends of the second contact portions 54-2$a$. Therefore, the destructive breakdown withstand capability in the vicinity of the FWD region 70 can be improved.

A sixth distance L6 is defined as the shortest distance in the X-axis direction between an end of the FWD region 70

(upper surface side boundary 74) and a second contact portion 54-2b closest to the FWD region 70 among the second contact portions 54-2b. As described above, the semiconductor substrate 10 may include the FWD region 70, a portion in contact with the FWD region 70 in the IGBT region 80, and a lifetime killer region 26. A seventh distance L7 is defined as the shortest distance in the X-axis direction between the end of the FWD region 70 (upper surface side boundary 74) and an end 25 of the lifetime killer region 26 in the IGBT region 80. The sixth distance L6 may be equal to or shorter than the seventh distance L7. The sixth distance L6 may be half or less of the seventh distance L7.

The sixth distance L6 may be half or more of a thickness of the semiconductor substrate 10 and may be equal to or less than the thickness. The sixth distance L6 may be 50 μm or more and may be 80 μm or more. The sixth distance L6 may be 150 μm or less and may be 100 μm or less. An appropriate setting of the sixth distance L6 can maximize an effective region in the IGBT region 80 while suppressing the concentration of holes at edges of the contact portions 54-2b.

A length L15 in the Y-axis direction of a contact region 15 closest to the gate runner layer 46 in the Y-axis direction may be 10 μm or more and may be 15 μm or more. The length L15 of the contact region 15 may be longer than a length L16 of another contact region 15 arranged closer to the center side in the IGBT region 80 than the contact region 15. Increasing the length L15 of the contact region 15 arranged in the vicinity of the gate runner layer 46 can ensure a distance between the emitter region 12 and the gate runner layer 46.

Variation is likely to be caused in the quality of a resist mask which is formed in a photoetching process in the vicinity of the gate runner layer 46 by being affected by a level difference of the gate runner layer 46. Therefore, if a distance between the emitter region 12 and the gate runner layer 46 is short, the variation in dimension of a resist mask used for forming the emitter region 12 is caused, and thus, impurities may not be accuracy implanted in the partial emitter region 12 in some cases. The variation in implantation of impurities results in the variation of a threshold voltage and the like of a transistor. As described above, increasing a length of an outermost contact region 15 in the Y-axis direction can sufficiently ensure a distance between each of the emitter regions 12 and the gate runner layer 46 and can accuracy implant impurities in the respective emitter regions 12. The structure of the contact region 15 can be applied to any embodiment.

In the present example, second contact portions 54-2 extend longer than the first contact portions 54-1. Specifically, second contact portions 54-2 extend to a position overlapping with the well region 17. As a result, emitter regions 12 may be provided in a range where the second contact portions 54-2 extend longer than the first contact portions 54-1 to increase a total emitter length obtained by summing the partial length in which the emitter regions 12 is in contact with each gate trench portion 40 for the total number of cells. Even in this case, the length L15 of the contact region 15 closest to the gate runner layer 46 in the Y-axis direction may be longer than the length L16 of another contact region 15 arranged closer to the center side of the IGBT region 80 than the contact region 15.

FIG. 20 illustrates a positional relationship between each contact portion 54 and the end 19 of the accumulation region 16 in the fifth embodiment. In the present example, a position of the end 19 of the accumulation region 16 in the Y-axis direction changes depending on positions of ends of the individual contact portions 54 in the Y-axis direction. Therefore, ends 19 of at least some of accumulation regions 16 in the IGBT region 80 are closer to the well region 17 than ends 19 of accumulation regions 16 in the FWD region 70. This can increase an effective region in which accumulation regions 16 are provided. In the present example a position of an end 19 in the Y-axis direction changes stepwise depending on the second contact portions 54-2b and the second contact portions 54-2a. The accumulation regions 16 are provided at a position not overlapping with the well region 17.

FIG. 21 illustrates a positional relationship between each contact portion 54 and an end 19 of each accumulation region 16 in the sixth embodiment. In the present example also, a position of an end 19 of each accumulation region 16 in the Y-axis direction changes depending on positions of ends of individual contact portions 54 in the Y-axis direction. In the present example, a position of an end 19 in the Y-axis direction sequentially changes in a region where the second contact portions 54-2a are provided. That is, in a region where the second contact portions 54-2a are provided, a distance between each end 19 and the well region 17 becomes shorter as the second contact portions 54-2a are closer to the second contact portions 54-2b.

Ends 19 of each accumulation region 16 in the fifth embodiment and the sixth embodiment may be similar to those in examples illustrated in FIG. 19. That is, a distance between an end 19 of each accumulation region 16 and the well region 17 may be constant without being affected by a position of an end of each contact portion 54. In the example of FIG. 19, an end 19 of each accumulation region 16 overlaps an outermost contact region 15 in the Y-axis direction. In each example, an end 19 of each accumulation region 16 may be arranged closer to the center side of an active region 100 than an end of each contact portion 54 in the Y-axis direction.

FIG. 22 is an enlarged view of an edge 41 of each gate trench portion 40. As illustrated in FIG. 22, two gate trench portions 40 linearly extending in the Y-axis direction are connected with each other via an edge 41. At least a part of the edge 41 has a curved shape when seen from above. A curvature radius of the edge 41 is set as r. For the curvature radius of the edge 41, a curvature radius of an outer edge of the edge 41 may be used. The curvature radius r is preferably 1.15 μm or more. The curvature radius r may be 2.0 μm or more. A pitch of the gate trench portions 40 linearly extending in the Y-axis direction is set as P. The pitch P of the gate trench portions 40 may correspond to a distance between edges of the two gate trench portions 40 in the positive X-axis direction. The curvature radius r may be half or more of the pitch P and may be three-fourths or more of the pitch P.

A small curvature radius r may result in a thin gate insulating film 42 of each gate trench portion 40. Further, a small curvature radius r may result in a small trench width at the edge 41 because of a poor etching accuracy. An increase in the curvature radius r can maintain a thickness of the gate insulating film 42 and also maintain a trench width.

To increase the curvature radius of the edge 41, a dummy trench portion 30 is preferably arranged between the two gate trench portions 40 connected via the edge 41. This can easily increase the curvature radius of the edge 41 without increasing a width of a mesa region 60.

FIG. 23 illustrates exemplary shapes of gate trench portions 40 and dummy trench portions 30 when seen from above. In the present example, two dummy trench portions 30 are provided between two gate trench portions 40 connected via an edge 41. The two dummy trench portions 30 are connected with each other via a curved edge 31. This structure can also increase a curvature radius of an edge 41 easily. The gate trench portions 40 and the dummy trench portions 30 illustrated in FIG. 22 and FIG. 23 can be applied to any embodiment.

While the embodiments of the present invention have been described, the technical scope of the present invention is not limited to the above described embodiments. It is apparent to those skilled in the art that various alterations or improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 13: anode region, 14: base region, 15: contact region, 16: accumulation region, 17: well region, 18: drift region, 19: end, 20: buffer region, 22: collector region, 24: collector electrode, 25: end, 26: lifetime killer region, 27, 28: connection layer, 30: dummy trench portion, 31: edge, 32: dummy trench insulating film, 33: dummy trench conductive portion, 34: dummy trench, 36: insulating film, 38: interlayer dielectric film, 40: gate trench portion, 41: edge, 42: gate insulating film, 43: gate conductive portion, 44: gate trench, 46: gate runner layer, 47: contact portion, 48: gate metal layer, 50: emitter electrode, 52, 53, 54: contact portion, 55: end, 56: non-overlapping region, 58: overlapping region, 60: mesa region, 61: boundary mesa region, 62: upper surface, 64: lower surface, 66: outer peripheral end, 70: FWD region, 72: cathode region, 74: upper surface side boundary, 80: IGBT region, 82: lower surface side boundary, 92: end, 94: end, 96: bottom, 98: end, 100: active region, 110: gate runner portion, 112: ring gate runner portion, 114: extending gate runner portion, 120: gate pad section, 130: edge termination region, 200: semiconductor device

What is claimed is:

1. A semiconductor device including a transistor region and a diode region in a semiconductor substrate, the semiconductor device comprising:
   a gate runner portion that supplies a gate potential to the transistor region; and
   a well region of a first conductivity type provided below the gate runner portion;
   an interlayer dielectric film provided above the semiconductor substrate;
   a cathode region of a second conductivity type provided in the diode region and exposed at a lower surface side of the semiconductor substrate;
   a first contact portion that includes (i) one or more inner contact portions provided in a first region of the interlayer dielectric film and extending in a first direction and (ii) one or more outer contact portions provided in a second region of the interlayer dielectric film and extending in the first direction, the first region being located above and overlapping the cathode region, and the second region being located on an outside of the one or more inner contact portions in the first direction; and
   one or more second contact portions provided in the interlayer dielectric film in the transistor region and extending in the first direction,
   wherein at least one end of the one or more second contact portions extends further outside in the first direction than an end of the one or more outer contact portions,
   wherein the one or more inner contact portions are spaced apart from each other in a second direction perpendicular to the first direction,
   wherein the one or more outer contact portions are spaced apart from each other in the second direction,
   wherein the one or more outer contact portions are provided between the well region and the one or more inner contact portions in the first direction, and
   wherein the one or more outer contact portions are provided between the one or more second contact portions in the second direction.

2. The semiconductor device according to claim 1, wherein
   the end of the one or more outer contact portions is spaced apart from the well region in the first direction.

3. The semiconductor device according to claim 1, wherein
   the one or more second contact portions are spaced apart from each other in a second direction perpendicular to the first direction.

4. The semiconductor device according to claim 3, wherein
   when seen from above, the at least one end of the one or more second contact portions extends in the first direction to overlap the well region.

5. The semiconductor device according to claim 3, further comprising:
   an emitter electrode provided above the interlayer dielectric film;
   an anode region of the first conductivity type electrically connected to the emitter electrode in the diode region via the first contact portion;
   a base region of the first conductivity type electrically connected to the emitter electrode in the transistor region via the one or more second contact portions; and
   an emitter region of the second conductivity type electrically connected to the emitter electrode in the transistor region via the one or more second contact portions.

6. The semiconductor device according to claim 5, further comprising:
   a trench portion that is provided from an upper surface of the semiconductor substrate to a predetermined depth and includes a plurality of longitudinal portions extending in the first direction; and
   a plurality of mesa regions provided between two longitudinal portions of the plurality of longitudinal portions, wherein
   the trench portion includes a gate trench portion provided in the transistor region.

7. The semiconductor device according to claim 6, wherein
   the plurality of mesa regions include a boundary mesa region that is provided adjacent to the diode region in the second direction and does not include the emitter region, and the trench portion includes a dummy trench portion in contact with the boundary mesa region.

8. The semiconductor device according to claim 7, further comprising:
the diode region is located, in the second direction, between the dummy trench portion in contact with the boundary mesa region of one transistor region and the dummy trench portion in contact with the boundary mesa region of another transistor region, the one transistor region and the other transistor region adjacent to the diode region.

9. The semiconductor device according to claim 8, wherein
the one or more second contact portions include a plurality of boundary contact portions provided adjacent to the diode region, and
positions of end of the plurality of boundary contact portions in the first direction change sequentially.

10. The semiconductor device according to claim 8, wherein
the one or more second contact portions include a plurality of boundary contact portions provided adjacent to the diode region, and
positions of end of the plurality of boundary contact portions in the first direction change stepwise.

11. The semiconductor device according to claim 9, wherein
as the plurality of boundary contact portions are further spaced away from the diode region in the second direction, the end of the plurality of boundary contact portions extends further outside in the first direction.

12. The semiconductor device according to claim 11, wherein
at least one of the plurality of boundary contact portions is connected to the boundary mesa region.

13. The semiconductor device according to claim 8, further comprising
a lifetime killer region provided at least in the diode region.

14. The semiconductor device according to claim 13, wherein
the lifetime killer region includes a concentration distribution peak of a lifetime killer at a position closer to a lower surface of the semiconductor substrate than a bottom of the well region.

15. The semiconductor device according to claim 13, wherein
the lifetime killer region is provided in a wider range than the cathode region.

16. The semiconductor device according to claim 6, wherein
when seen from above, at least a part of the trench portion has a curved shape with a curvature radius equals to or larger than 1.15 μm.

17. The semiconductor device according to claim 6, wherein
when seen from above, at least a part of the trench portion has a curved shape, and
a curvature radius of the curved shape is equal to or larger than a half of a pitch of the plurality of longitudinal portions of the gate trench portion in the second direction.

18. The semiconductor device according to claim 1, wherein at least one of the one or more outer contact portions is contiguous to at least one of the one or more inner contact portions in the first direction.

19. A semiconductor device including a transistor region and a diode region in a semiconductor substrate, the semiconductor device comprising:
a gate runner portion that supplies a gate potential to the transistor region;
a well region of a first conductivity type provided below the gate runner portion;
an interlayer dielectric film provided above the semiconductor substrate;
one or more first contact portions provided in the interlayer dielectric film in the diode region and extending in a first direction such that, when seen from above, an end of the one or more first contact portions does not overlap the well region; and
one or more second contact portions provided in the interlayer dielectric film in the transistor region and extending in the first direction such that, when seen from above, an end of the one or more second contact portions overlaps the well region.

20. A method of manufacturing a semiconductor device including a transistor region and a diode region in a semiconductor substrate, the semiconductor device comprising a gate runner portion that supplies a gate potential to the transistor region, a well region of a first conductivity type provided below the gate runner portion, and a cathode region of a second conductivity type provided in the diode region and exposed at a lower surface side of the semiconductor substrate, the method comprising:
forming an interlayer dielectric film above the semiconductor substrate;
forming a first contact portion that includes (i) one or more inner contact portions provided in a first region of the interlayer dielectric film and extending in a first direction and (ii) one or more outer contact portions provided in a second region of the interlayer dielectric film and extending in the first direction, the first region being located above and overlapping the cathode region, and the second region being located on an outside of the one or more inner contact portions in the first direction; and
forming one or more second contact portions in the interlayer dielectric film in the transistor region and extending in the first direction such that at least one end of the one or more second contact portions extends further outside in the first direction than an end of the one or more outer contact portions,
wherein the one or more inner contact portions are spaced apart from each other in a second direction perpendicular to the first direction,
wherein the one or more outer contact portions are spaced apart from each other in the second direction,
wherein the one or more outer contact portions are provided between the well region and the one or more inner contact portions in the first direction, and
wherein the one or more outer contact portions are provided between the one or more second contact portions in the second direction.

* * * * *